US012813114B2

(12) United States Patent
Du et al.

(10) Patent No.: US 12,813,114 B2
(45) **Date of Patent: *Nov. 24, 2026**

(54) DISPLAY PANEL AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Lili Du, Beijing (CN); Ming Hu, Beijing (CN); Hongjun Zhou, Beijing (CN); Yue Long, Beijing (CN); Cong Liu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 19/261,751

(22) Filed: Jul. 7, 2025

(65) Prior Publication Data

US 2025/0338726 A1 Oct. 30, 2025

Related U.S. Application Data

(63) Continuation of application No. 18/739,494, filed on Jun. 11, 2024, now Pat. No. 12,408,516, which is a (Continued)

(30) Foreign Application Priority Data

Sep. 29, 2020 (WO) ................ PCT/CN2020/119087

(51) Int. Cl.
*G09G 3/30* (2006.01)
*H10K 59/122* (2023.01)
(Continued)

(52) U.S. Cl.
CPC ......... *H10K 59/131* (2023.02); *H10K 59/122* (2023.02); *H10K 59/124* (2023.02);
(Continued)

(58) Field of Classification Search
CPC .. H10K 59/131; H10K 59/353; H10K 59/122; H10K 59/124; G09G 3/30; G09G 2300/0426
(Continued)

(56) References Cited

U.S. PATENT DOCUMENTS 12,069,911 B2 * 8/2024 Du ...................... H10K 59/131
12,114,544 B2 10/2024 Du et al.
(Continued)

FOREIGN PATENT DOCUMENTS

CN 110707134 A 1/2020

OTHER PUBLICATIONS

U.S. NonFinal Office Action, mailed Apr. 28, 2026, from U.S. Appl. No. 18/771,625, 21 pages.

*Primary Examiner* — Jennifer T Nguyen
(74) *Attorney, Agent, or Firm* — Workman Nydegger

(57) ABSTRACT

A display panel and a display apparatus are provided. The display panel includes a supporting layer. The supporting layer includes first spacers and second spacers, which are located on different columns; an anode of at least one of sub pixels corresponding to first spacers extends in a first direction, the first and second spacers extend in a second direction; the first spacers and sub pixels are arranged alternately in the column direction and correspond one-to-one; an orthographic projection of first spacers does not overlap with that of anodes in all sub pixels in the column direction; a first ratio is formed between areas of the first spacers and openings of corresponding sub pixels, a second ratio is formed between an area of the second spacers and an
(Continued)

area sum of the openings between two adjacent second spacers in the column direction, the first ratio is different from the second ratio.

17 Claims, 16 Drawing Sheets

Related U.S. Application Data continuation of application No. 17/424,769, filed as application No. PCT/CN2020/124166 on Oct. 27, 2020, now Pat. No. 12,069,911.

(51) Int. Cl.

| | |
|---|---|
| ***H10K 59/124*** | (2023.01) |
| ***H10K 59/131*** | (2023.01) |
| ***H10K 59/35*** | (2023.01) |

(52) U.S. Cl.
CPC ............. *H10K 59/353* (2023.02); *G09G 3/30* (2013.01); *G09G 2300/0426* (2013.01)

(58) Field of Classification Search
USPC ............................................................ 345/76
See application file for complete search history.

(56) References Cited

U.S. PATENT DOCUMENTS

| | | | | |
|---|---|---|---|---|
| 12,408,516 | B1 * | 9/2025 | Du | H10K 59/131 |
| 2015/0102320 | A1 * | 4/2015 | Jung | H10K 59/353 257/40 |
| 2018/0351127 | A1 * | 12/2018 | So | H10K 50/16 |
| 2021/0135149 | A1 * | 5/2021 | Xin | H10K 59/1315 |
| 2021/0143189 | A1 * | 5/2021 | Kim | H10D 86/421 |

* cited by examiner

0330

DISPLAY PANEL AND DISPLAY APPARATUS

CROSS-REFERENCE TO RELATED APPLICATIONS

The present application is a continuation of U.S. patent application Ser. No. 18/739,494, filed on Jun. 11, 2024, which is a continuation of U.S. patent application Ser. No. 17/424,769, filed on Jul. 21, 2021, which is a National Stage of International Application No. PCT/CN2020/124166, filed on Oct. 27, 2020, which claims the priority of the Chinese patent application PCT/CN2020/119087 filed to the China National Intellectual Property Administration on Sep. 29, 2020, and entitled “Display Panel and Display Apparatus”, of which the entire contents are incorporated herein by reference.

FIELD

Embodiments of the present disclosure relate to the field of display, in particular to a display panel and a display apparatus.

BACKGROUND

Along with constant development of a display technology, an organic light emitting diode (OLED) display panel has been increasingly applied to various electronic devices due to its advantages of self-illumination, wide viewing angle, high contrast, low power consumption, high response speed and so on. Along with enhancement of requirements of people for the OLED display panel and in order to realize high-resolution design in the display panel, the OLED display panel generally adopts an SPR pixel arrangement, namely, a pixel borrowing mode.

SUMMARY

A display panel provided by an embodiment of the present disclosure, including:

a base substrate, including a plurality of sub pixels;

a first electrode layer, located on the base substrate and including anodes located in all the sub pixels, wherein each anode includes a main body part and a via hole part which are electrically connected with each other;

a pixel defining layer, located on one side of the first electrode layer facing away from the base substrate, wherein the pixel defining layer includes openings located in all the sub pixels, and in the same sub pixel, an orthographic projection of the opening on the base substrate is located in an orthographic projection of the main body part on the base substrate; and a supporting layer, located on one side of the pixel defining layer facing away from the base substrate; wherein the supporting layer includes a plurality of columns of first spacers and a plurality of columns of second spacers; the first spacers and the second spacers are located on the different columns; one column of the first spacers corresponds to one column of the sub pixels, and one column of the second spacers corresponds to the other column of the sub pixels; a quantity of the sub pixels in the columns where the first spacers are located is different from a quantity of the sub pixels in the columns where the second spacers are located;

the anode of at least one of the sub pixels corresponding to the first spacers extends in a first direction, and the first spacers and the second spacers extend in a second direction respectively;

as for the first spacers and corresponding sub pixels, the first spacers in a column direction and the sub pixels are arranged alternately and repeatedly in the column direction and correspond in a one-to-one mode;

an orthographic projection of the first spacers in the column direction does not overlap with an orthographic projection of the anodes in all the sub pixels in the column direction; and a first ratio is formed between an area of the first spacers and an area of the openings of the corresponding sub pixels, a second ratio is formed between an area of the second spacers and an area sum of the openings of all the sub pixels between the two second spacers adjacent in the column direction, and the first ratio is different from the second ratio.

In some embodiments, the first ratio is greater than the second ratio.

In some embodiments, an area ratio of the first spacers adjacent in the column direction is 0.8-1.2.

In some embodiments, a first spacing distance is formed between the first spacers adjacent in the column direction, a second spacing distance is formed between the second spacers adjacent in the column direction, and the second spacing distance is greater than the first spacing distance.

In some embodiments, a width of the first spacers in the column direction is greater than that of the second spacers in the column direction; and a width of the first spacers in a row direction is not less than that of the second spacers in the row direction.

In some embodiments, the sub pixels corresponding to the second spacers include first-color sub pixels and second-color sub pixels, wherein an anode of one first-color sub pixel and an anode of one second-color sub pixel are disposed between the second spacers adjacent in the column direction; and the sub pixels corresponding to the first spacers include third-color sub pixels, wherein an anode of one third-color sub pixel is disposed between the first spacers adjacent in the column direction.

In some embodiments, the columns where the first spacers are located and the columns where the second spacers are located are arranged alternately in the row direction; and the first spacers and the second spacers are arranged alternately on one straight line in the row direction.

In some embodiments, a third ratio is formed between the width of the first spacers in the row direction and a width of the main body parts of the anodes in the corresponding sub pixels in the row direction;

a fourth ratio is formed between the width of the second spacers in the row direction and a width of the main body part of the anode in one sub pixel between the two second spacers adjacent in the column direction in the row direction; and the third ratio is greater than the fourth ratio.

In some embodiments, the supporting layer further includes a plurality of third spacers disposed at intervals with the first spacers and the second spacers, and an area of the third spacers is different from the area of the first spacers; and an orthographic projection of the third spacers in the column direction does not overlap with orthographic projections of both the first spacers and the second spacers in the column direction.

In some embodiments, the second spacers and the third spacers are arranged alternately in one column, and the main body part of the anode of one first-color sub pixel or one second-color sub pixel is disposed between the adjacent second spacer and third spacer.

In some embodiments, a fifth ratio is formed between an area of the third spacers and the area of the second spacers and is 0.8-1.2.

In some embodiments, an overlapped region is at least formed between an orthographic projection of the third spacers on the base substrate and an orthographic projection of the via hole parts in the first-color sub pixels on the base substrate.

In some embodiments, a sixth ratio is formed between a width of the third spacers in the column direction and a width of the openings in the first-color sub pixels in the column direction and is 0.4-0.8; and a seventh ratio is formed between the width of the second spacers in the column direction and a width of the openings in the second-color sub pixels in the column direction and is 0.4-0.8.

In some embodiments, in the column direction, a first spacing is formed between the first spacers and the openings of the adjacent third-color sub pixels;

in the column direction, a second spacing is formed between the second spacers and the openings of the nearest-adjacent second-color sub pixels, and a third spacing is formed between the second spacers and the openings of the nearest-adjacent first-color sub pixels;

in the column direction, a fourth spacing is formed between the third spacers and the openings of the nearest-adjacent second-color sub pixels, and a fifth spacing is formed between the third spacers and the openings of the nearest-adjacent first-color sub pixels; and the second spacing, the third spacing, the fourth spacing and the fifth spacing are each less than the first spacing.

In some embodiments, a ratio between the second spacing and the third spacing is 0.8-1.2; and a ratio between the fourth spacing and the fifth spacing is 0.8-1.2.

In some embodiments, in the first-color sub pixels, a distance between a boundary of the orthographic projection of the openings on the base substrate and a nearest-adjacent boundary of an orthographic projection of the main body parts in the first-color sub pixels on the base substrate in the row direction is 1.5-3.0 μm; and/or in the first-color sub pixels, a distance between the boundary of the orthographic projection of the openings on the base substrate and the nearest-adjacent boundary of the orthographic projection of the main body parts in the first-color sub pixels on the base substrate in the column direction is 1.5-3.0 μm.

In some embodiments, in the second-color sub pixels, a distance between the boundary of the orthographic projection of the openings on the base substrate and a nearest-adjacent boundary of an orthographic projection of the main body parts in the second-color sub pixels on the base substrate in the row direction is 1.5-3.0 μm; and/or in the second-color sub pixels, a distance between the boundary of the orthographic projection of the openings on the base substrate and the nearest-adjacent boundary of the orthographic projection of the main body parts in the second-color sub pixels on the base substrate in the column direction is 1.5-3.0 μm.

In some embodiments, in the third-color sub pixels, a distance between the boundary of the orthographic projection of the openings on the base substrate and a nearest-adjacent boundary of an orthographic projection of the main body parts in the third-color sub pixels on the base substrate in the row direction is 1.5-3.0 μm; and/or in the third-color sub pixels, a distance between the boundary of the orthographic projection of the openings on the base substrate and the nearest-adjacent boundary of the orthographic projection of the main body parts in the third-color sub pixels on the base substrate in the column direction is 1.5-3.0 μm.

In some embodiments, the display panel includes a plurality of repeating units, and the repeating units include the first-color sub pixels, the second-color sub pixels and the third-color sub pixels; in the same repeating unit, the anode in the first-color sub pixel and the anode in the second-color sub pixel are arranged in the column direction; and in the same repeating unit, a distance between the opening in the first-color sub pixel and the opening in the second-color sub pixel in the first direction is 15-20 μm.

In some embodiments, in the same repeating unit, connecting lines among the anodes in the first-color sub pixel, the second-color sub pixel and the third-color sub pixel constitute a triangle; and in the same repeating unit, a distance between the opening in the first-color sub pixel and the opening in the third-color sub pixel in the second direction is 15-20 μm.

In some embodiments, a first recess is formed on one side of an orthographic projection of one edges of the anodes in the second-color sub pixels on the base substrate facing an orthographic projection of the anodes in the first-color sub pixels on the base substrate, and the first recess is disposed towards centers of the main body parts of the second-color sub pixels; and orthographic projections of both the second spacers and the third spacers arranged in the column direction in the row direction cover an orthographic projection of the first recess in the row direction.

In some embodiments, an overlapped region is formed between the orthographic projection of the third spacers in the column direction and an orthographic projection of the via hole parts in the second-color sub pixels in the column direction.

In some embodiments, a second recess is formed on one side of the orthographic projection of the main body parts in the third-color sub pixels on the base substrate facing an orthographic projection of the via hole parts in the second-color sub pixels on the base substrate; and the orthographic projection of the third spacers in the column direction is located in an orthographic projection of the second recess in the column direction.

In some embodiments, in the row direction, the third spacers, the via hole parts in the first-color sub pixels, the via hole parts in the second-color sub pixels and the via hole parts in the third-color sub pixels are arranged on the same straight line.

A display apparatus provided by an embodiment of the present disclosure, including the above display panel.

DETAILED DESCRIPTION OF THE EMBODIMENTS

Figure 1:
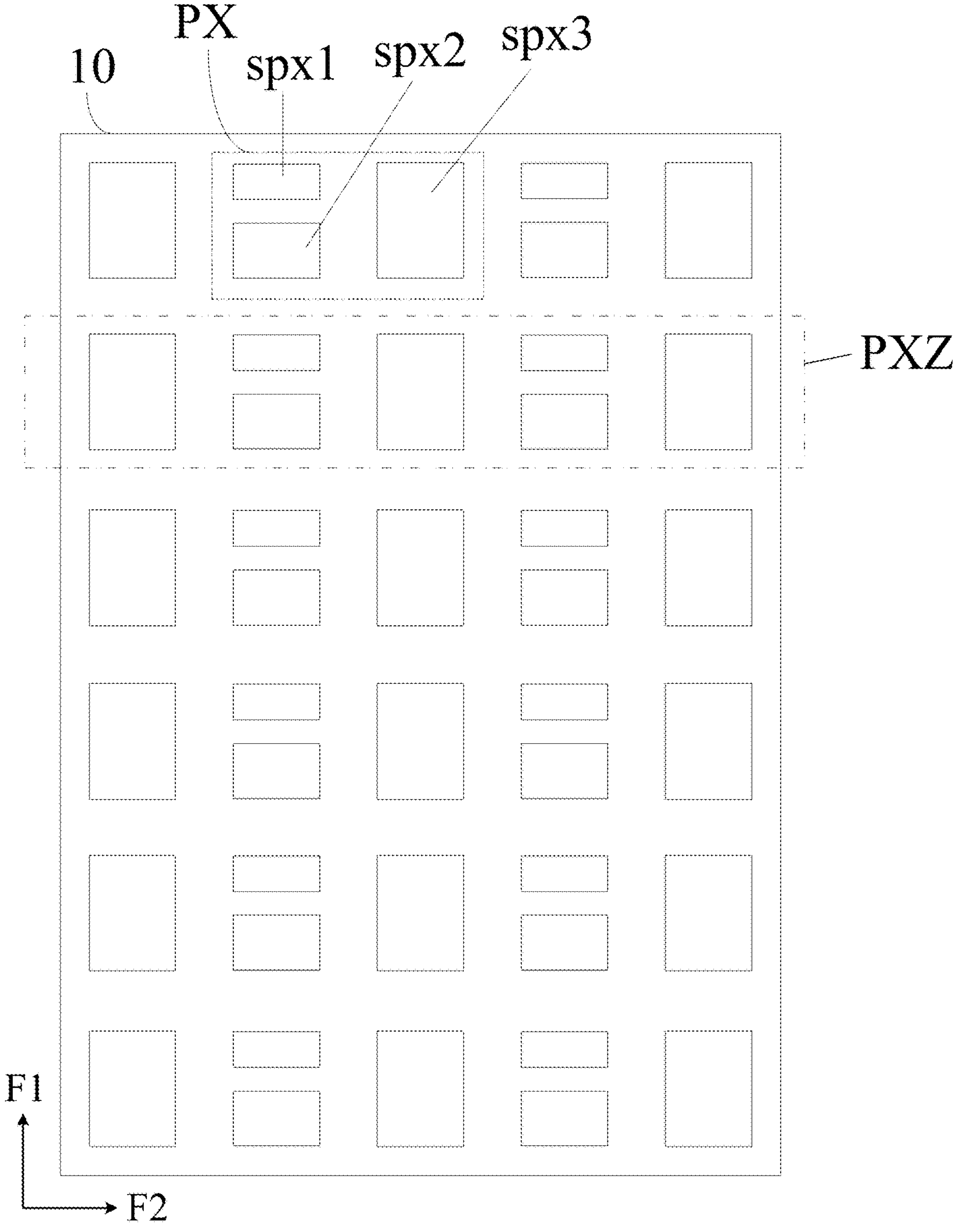
FIG. 1 is a schematic structural diagram of a display panel provided by an embodiment of the present disclosure.

In order to make the objective, technical solutions and advantages of the embodiments of the present disclosure more clear, the technical solutions of the embodiments of the present disclosure will be described clearly and completely below with reference to the drawings of the embodiments of the present disclosure. Obviously, the described embodiments are part of the embodiments of the present disclosure, but not all the embodiments. The embodiments in the present disclosure and characteristics in the embodiments can be mutually combined in the case of no conflict. On the basis of the described embodiments of the present disclosure, all other embodiments obtained by a person of ordinary skill in the art without inventive efforts fall within the protection scope of the present disclosure.

Unless otherwise defined, the technical or scientific terms used in the present disclosure shall have the usual meanings understood by a person of ordinary skill in the art to which the present disclosure belongs. The words "first", "second" and the like used in the present disclosure do not indicate any order, quantity or importance, but are only used to distinguish different components. The word "including" or "comprising" and the like, means that an element or item preceding the word contains an element or item listed after the word and the equivalent thereof, without excluding other elements or items. The word "connection" or "coupling" and the like is not restricted to physical or mechanical connection, but may include electrical connection, whether direct or indirect.

It should be noted that the sizes and shapes of all graphs in the drawings do not reflect the true scale, and only intend to illustrate the contents of the present disclosure. The same or similar reference numbers represent the same or similar elements or elements with the same or similar functions from beginning to end.

As shown in FIG. 1, a display panel provided by an embodiment of the present disclosure may include: a base substrate 10 and a plurality of sub pixels located on the base substrate 10. Exemplarily, the plurality of sub pixels may include red sub pixels, green sub pixels and blue sub pixels. In this way, the display panel may adopt the red sub pixels, the green sub pixels and the blue sub pixels for light mixing so as to realize color display. Certainly, the embodiment of the present disclosure includes but is not limited to this.

Figure 2A:
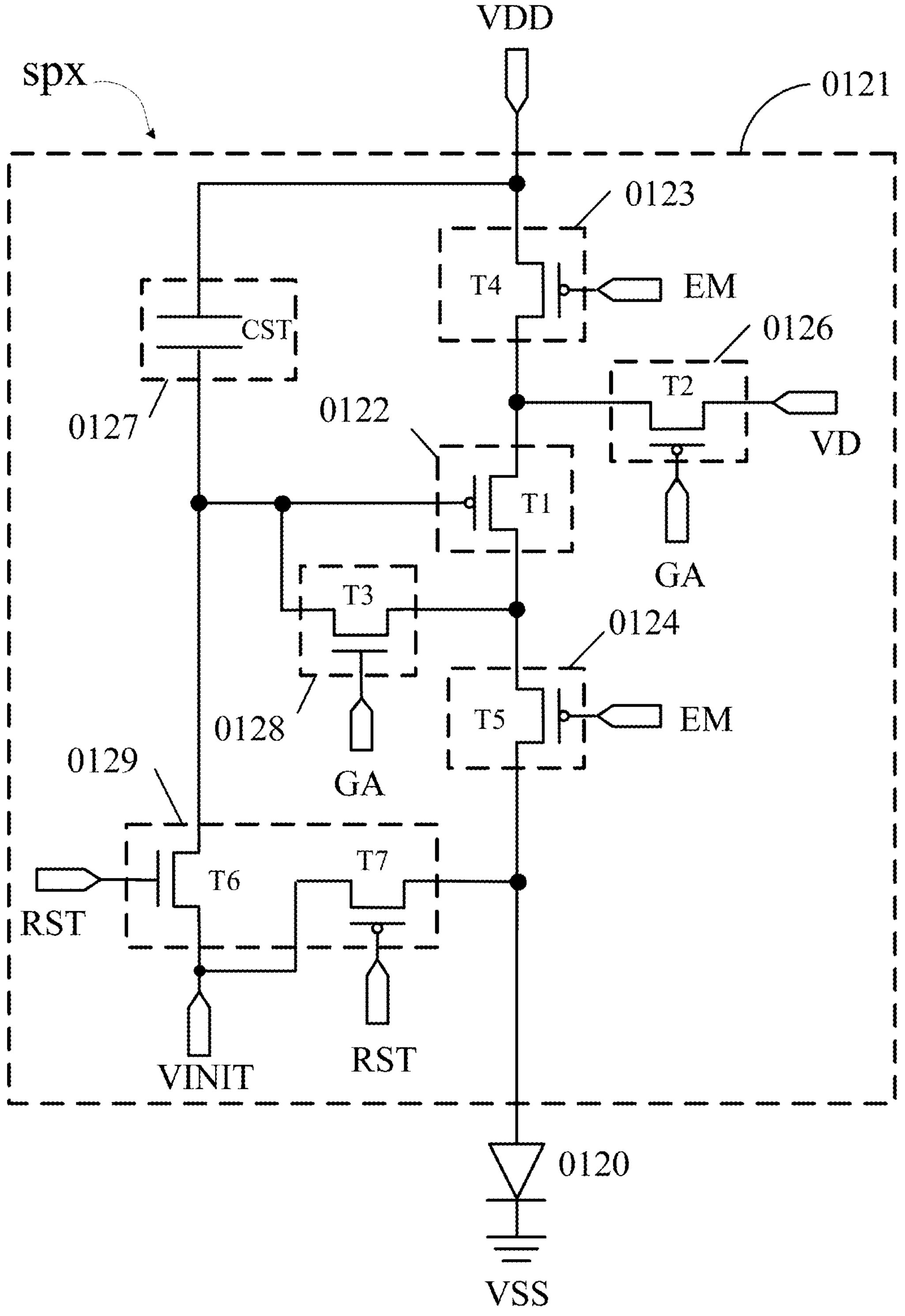
FIG. 2A is a schematic structural diagram of a pixel circuit provided by an embodiment of the present disclosure.

Exemplarily, as shown in FIG. 1 and FIG. 2A, at least one sub pixel (for example, each sub pixel) in the plurality of sub pixels may include: a pixel circuit 0121 and a light emitting element 0120. The pixel circuit 0121 has a transistor and a capacitor and generates an electric signal through interaction between the transistor and the capacitor, and the generated electric signal is input into an anode of the light emitting element 0120. Furthermore, a corresponding voltage is loaded to a cathode of the light emitting element 0120 so as to drive the light emitting element 0120 to emit light.

As shown in FIG. 2A, the pixel circuit 0121 may include: a driving control circuit 0122, a first light-emitting control circuit 0123, a second light-emitting control circuit 0124, a data write-in circuit 0126, a storage circuit 0127, a threshold compensation circuit 0128 and a reset circuit 0129.

The driving control circuit 0122 may include a control end, a first end and a second end. The driving control circuit 0122 is configured to provide a driving current for driving the light emitting element 0120 to emit the light for the light emitting element 0120. For example, the first light-emitting control circuit 0123 is connected with the first end of the driving control circuit 0122 and a first power end VDD and configured to realize connection conducting or disconnection between the driving control circuit 0122 and the first power end VDD.

The second light-emitting control circuit 0124 is electrically connected with the second end of the driving control circuit 0122 and the anode of the light emitting element 0120 and configured to realize connection conducting or disconnection between the driving control circuit 0122 and the light emitting element 0120.

The data write-in circuit 0126 is electrically connected with the first end of the driving control circuit 0122 and configured to write a signal on a data line VD into the storage circuit 0127.

The storage circuit 0127 is electrically connected with the control end of the driving control circuit 0122 and the first power end VDD and configured to store a data signal and information of the driving control circuit 0122.

The threshold compensation circuit 0128 is electrically connected with the control end and the second end of the driving control circuit 0122 respectively and configured to perform threshold compensation on the driving control circuit 0122.

The reset circuit 0129 is further electrically connected with the control end of the driving control circuit 0122 and the anode of the light emitting element 0120 respectively and configured to reset the anode of the light emitting element 0120 and reset the control end of the driving control circuit 0122.

The light emitting element 0120 may be disposed as an electroluminescent diode, such as at least one of an OLED, an QLED, a micro LED and a mini OLED, wherein the light emitting element 0120 may include the anode, a light emitting layer and the cathode disposed in a stacked mode. Further, the light emitting layer may further include film layers such as a hole injection layer, a hole transport layer, an electron transport layer and an electron injection layer. Certainly, in practical application, the light emitting element 0120 may be designed and determined according to demands of a practical application environment, which is not limited here.

Exemplarily, as shown in FIG. 2A, the driving control circuit 0122 includes: a driving transistor T1, the control end of the driving control circuit 0122 includes a gate electrode of the driving transistor T1, the first end of the driving control circuit 0122 includes a first electrode of the driving transistor T1, and the second end of the driving control circuit 0122 includes a second electrode of the driving transistor T1.

Exemplarily, as shown in FIG. 2A, the data write-in circuit 0126 includes a data write-in transistor T2. The storage circuit 0127 includes a storage capacitor CST. The threshold compensation circuit 0128 includes a threshold compensation transistor T3. The first light-emitting control circuit 0123 includes a light-emitting control transistor T4. The second light-emitting control circuit 0124 includes a conducting control transistor T5. The reset circuit 0129 includes an initializing transistor T6 and a reset transistor T7.

Optionally, a first electrode of the data write-in transistor T2 is electrically connected with the first electrode of the driving transistor T1, a second electrode of the data write-in transistor T2 is configured to be electrically connected with the data line VD so as to receive the data signal, and a gate electrode of the data write-in transistor T2 is configured to be electrically connected with a scanning line GA so as to receive a signal.

A first electrode of the storage capacitor CST is electrically connected with the first power end VDD, and a second electrode of the storage capacitor CST is electrically connected with the gate electrode of the driving transistor T1.

A first electrode of the threshold compensation transistor T3 is electrically connected with the second electrode of the driving transistor T1, a second electrode of the threshold compensation transistor T3 is electrically connected with the gate electrode of the driving transistor T1, and a gate electrode of the threshold compensation transistor T3 is configured to be electrically connected with the scanning line GA so as to receive a signal.

A first electrode of the initializing transistor T6 is configured to be electrically connected with an initializing line VINIT to receive a reset signal, a second electrode of the initializing transistor T6 is electrically connected with the gate electrode of the driving transistor T1, and a gate electrode of the initializing transistor T6 is configured to be electrically connected with a reset line RST to receive a signal.

A first electrode of the reset transistor T7 is configured to be electrically connected with the initializing line VINIT to receive the reset signal, a second electrode of the reset transistor T7 is electrically connected with the anode of the light emitting element 0120, and a gate electrode of the reset transistor T7 is configured to be electrically connected with the reset line RST to receive a signal.

A first electrode of the light-emitting control transistor T4 is electrically connected with the first power end VDD, a second electrode of the light-emitting control transistor T4 is electrically connected with the first electrode of the driving transistor T1, and a gate electrode of the light-emitting control transistor T4 is configured to be electrically connected with a light-emitting control line EM so as to receive a light-emitting control signal.

A first electrode of the conducting control transistor T5 is electrically connected with the second electrode of the driving transistor T1, a second electrode of the conducting control transistor T5 is electrically connected with the anode of the light emitting element 0120, and a gate electrode of the conducting control transistor T5 is configured to be electrically connected with the light-emitting control line EM so as to receive the light-emitting control signal.

The cathode of the light emitting element 0120 is electrically connected with a second power end VSS, wherein the first electrodes and the second electrodes of the above transistors can be determined as source electrodes or drain electrodes according to the practical application, which is not limited here.

Exemplarily, one of the first power end VDD and the second power end VSS is a high voltage end, and the other is a low voltage end. For example, in the embodiment as shown in FIG. 2A, the first power end VDD is a voltage source so as to output a constant first voltage, e.g., the first voltage is a positive voltage, while the second power end VSS may be a voltage source so as to output a constant second voltage, e.g., the second voltage is 0 or a negative voltage and so on. For example, in some embodiments, the second power end VSS may be grounded.

Figure 2B:
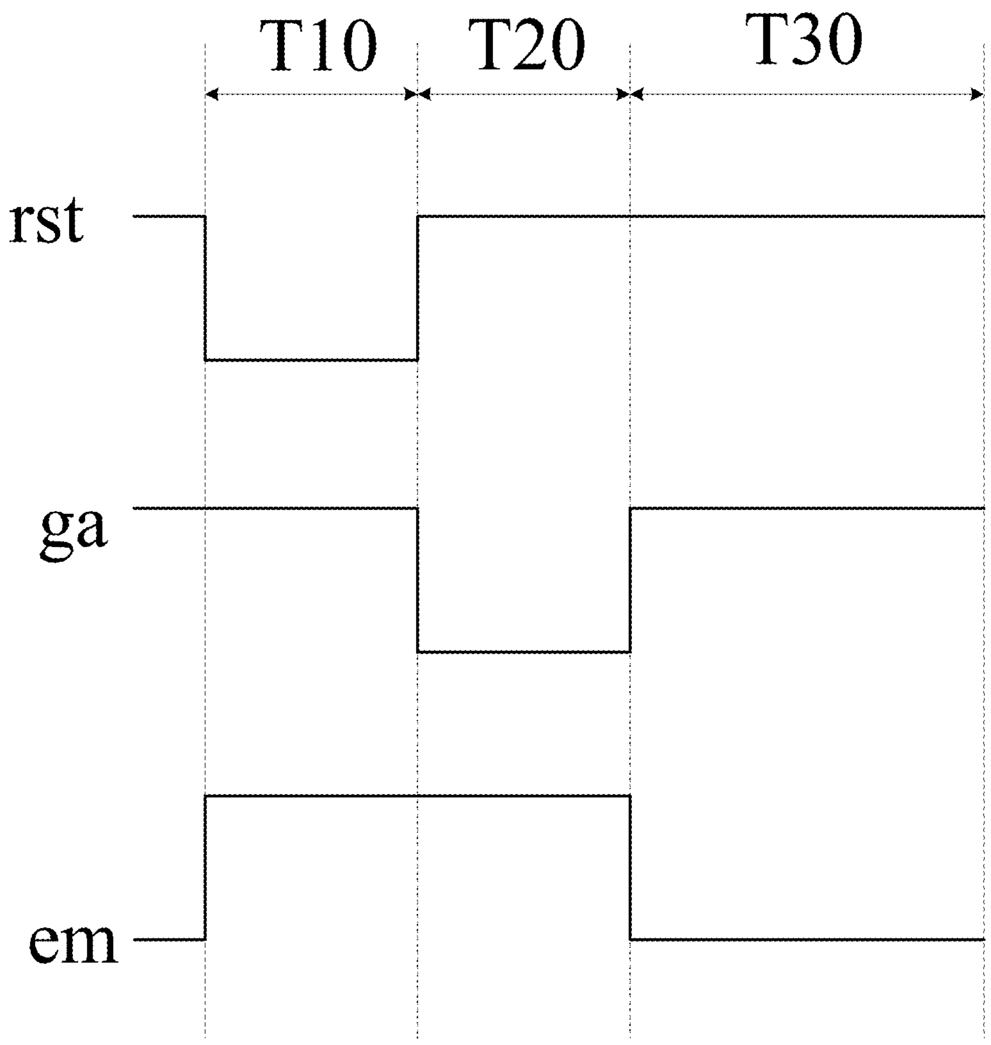
FIG. 2B is a signal sequence diagram provided by an embodiment of the present disclosure.

A signal sequence diagram corresponding to the pixel circuit as shown in FIG. 2A is as shown in FIG. 2B. In one frame of display time, a working process of the pixel circuit has three phases: a T10 phase, a T20 phase and a T30 phase, wherein rst represents a signal transmitted on the reset line RST, ga represents a signal transmitted on the scanning line GA, and em represents a signal transmitted on the light-emitting control line EM.

At the T10 phase, the signal rst controls the initializing transistor T6 to be conducted so that a signal transmitted on the initializing line VINIT can be provided to the gate electrode of the driving transistor T1 so as to reset the gate electrode of the driving transistor T1. The signal rst controls the reset transistor T7 to be conducted, so that the signal transmitted on the initializing line VINIT is provided to the anode of the light emitting element 0120 so as to reset the anode of the light emitting element 0120. Furthermore, in this phase, the signal ga controls the data write-in transistor T2 and the threshold compensation transistor T3 to be cut off. The signal em controls the light-emitting control transistor T4 and the conducting control transistor T5 to be cut off.

At the T20 phase, the signal ga controls the data write-in transistor T2 and the threshold compensation transistor T3 to be conducted, the conducted data write-in transistor T2 enables a data signal transmitted on the data line VD to charge the gate electrode of the driving transistor T1, so that a voltage of the gate electrode of the driving transistor T1 is changed into: Vdata+Vth, wherein Vth represents a threshold voltage of the driving transistor T1, and Vdata represents a voltage of the data signal. Furthermore, in this phase, the signal rst controls the initializing transistor T6 and the reset transistor T7 to be cut off. The signal em controls the light-emitting control transistor T4 and the conducting control transistor T5 to be cut off.

At the T30 phase, the signal em controls the light-emitting control transistor T4 and the conducting control transistor T5 to be conducted. The conducted light-emitting control transistor T4 provides a voltage Vdd of the first power end VDD to the first electrode of the driving transistor T1, so that a voltage of the first electrode of the driving transistor T1 is Vdd. The driving transistor T1 generates a driving current according to its voltage Vdata+|Vth| of the gate electrode and the voltage Vdd of the first electrode. The driving current is provided to the light emitting element 0120 through the conducted conducting control transistor T5 so as to drive the light emitting element 0120 to emit the light. Furthermore, in this phase, the signal rst controls the initializing transistor T6 and the reset transistor T7 to be cut off. The signal ga controls the data write-in transistor T2 and the threshold compensation transistor T3 to be cut off.

It should be noted that in the embodiment of the present disclosure, the first electrodes of the above transistors may be its source electrodes, and the second electrodes may be its drain electrodes; or the first electrodes may be its drain electrodes, and the second electrodes may be its source electrodes, which can be designed and determined according to the demands of the practical application. Furthermore, the pixel circuits in the sub pixels may further be of a structure including the transistors with other number except for structures as shown in FIG. 2A and FIG. 2B, which is not limited by the embodiment of the present disclosure. Illustration is made below by taking the structure as shown in FIG. 2A as an example.

Exemplarily, the display panel includes the base substrate 10, a transistor array layer disposed on the base substrate 10, a first planarization layer located on one side of the transistor array layer facing away from the base substrate 10, a first electrode layer located on one side of the first planarization layer facing away from the base substrate 10, a pixel defining layer located on one side of the first electrode layer facing away from the base substrate 10, a supporting layer 100 formed and located on one side of the pixel defining layer facing away from the base substrate 10, the light emitting layer located on one side of the pixel defining layer facing away from the base substrate 10, and the cathode located on one side of the light emitting layer facing away from the base substrate 10. The transistor array layer may be used to form the transistor and the capacitor in the pixel circuit and form the scanning line, the reset line, the light-emitting control line EM, the initializing line VINIT, a first power signal line VDD electrically connected with the first power end VDD, and so on. Exemplarily, the transistor array layer may include an active semiconductor layer 0310, a gate conductive layer 0320, a reference conductive layer 0330 and a source-drain metal layer 0340.

Figure 3:
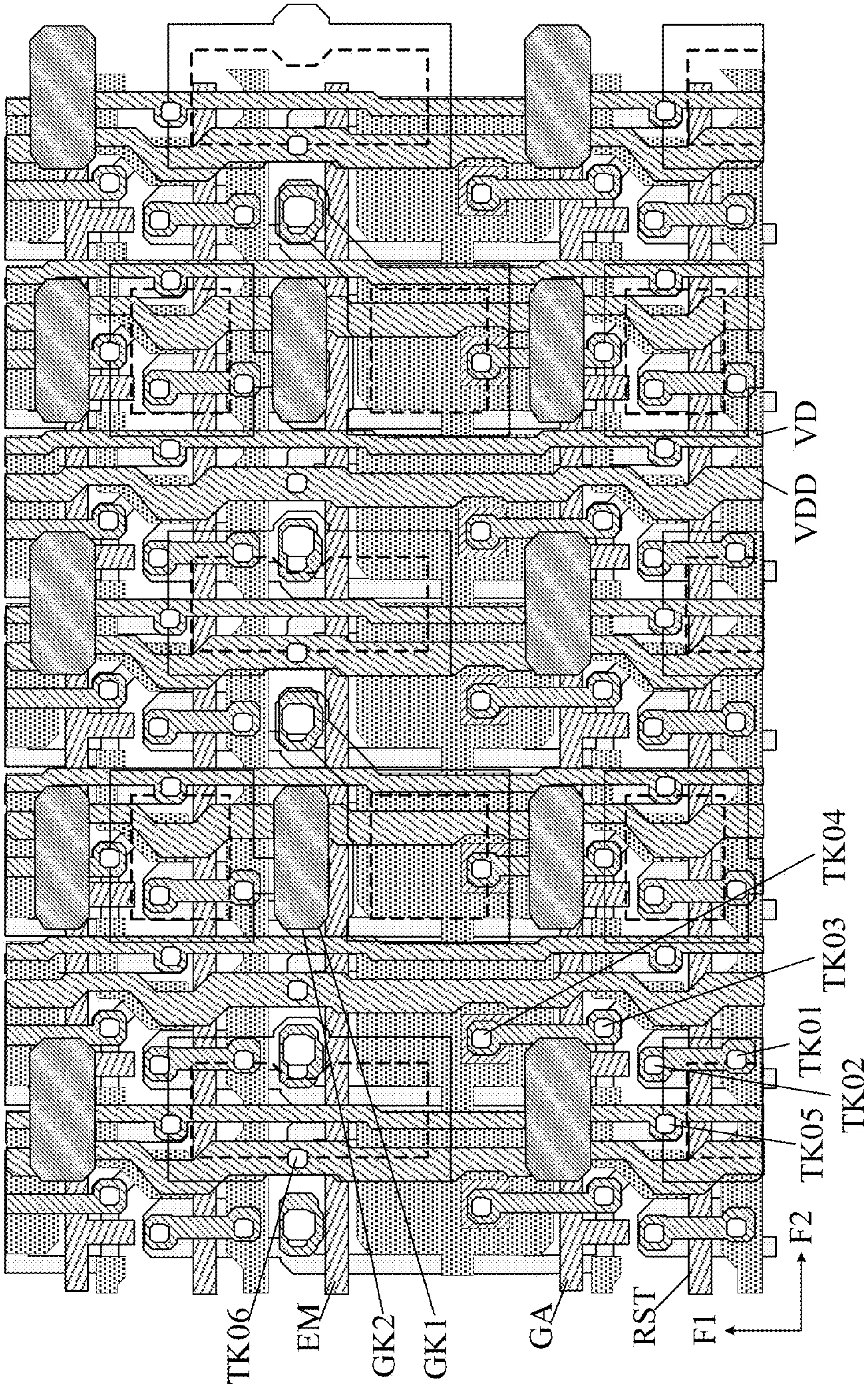
FIG. 3 is a schematic diagram of a layout structure of a display panel provided by an embodiment of the present disclosure.
Figure 4A:
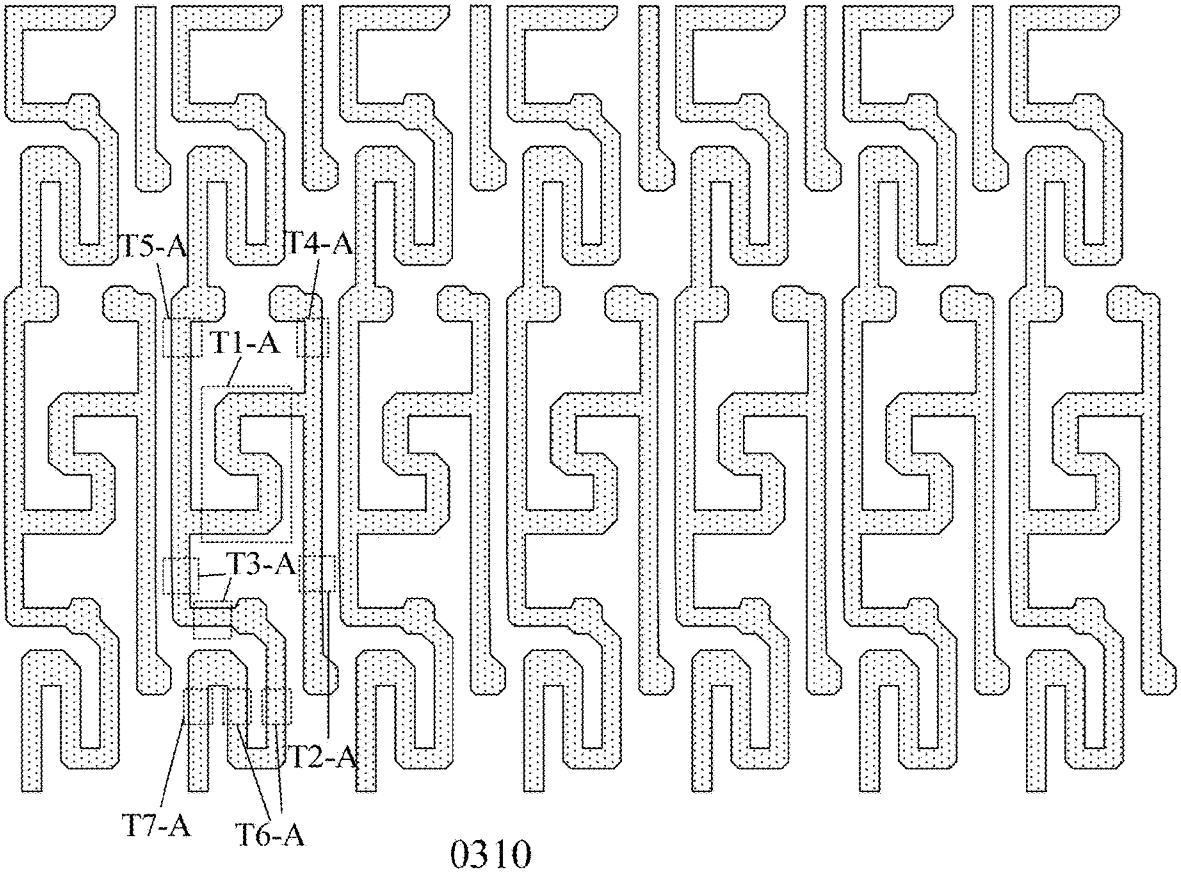
FIG. 4A is a schematic diagram of some active semiconductor layers provided by an embodiment of the present disclosure.

Exemplarily, FIG. 3 and FIG. 4A show the active semiconductor layer 0310 of the pixel circuit 0121. The active semiconductor layer 0310 may be formed by patterning by adopting a semiconductor material. The active semiconductor layer 0310 may be used to manufacture a driving active layer T1-A of the above driving transistor T1, an active layer T2-A of the data write-in transistor T2, an active layer T3-A of the threshold compensation transistor T3, an active layer T4-A of the light-emitting control transistor T4, an active layer T5-A of the conducting control transistor T5, an active layer T6-A of the initializing transistor T6, and an active layer T7-A of the reset transistor T7. Each active layer may include a source electrode region, a drain electrode region and a channel region between the source electrode region and the drain electrode region. For example, the active layers of all the transistors are integrally disposed.

Exemplarily, the active semiconductor layer 0310 may be manufactured by adopting amorphous silicon, polycrystalline silicon, an oxide semiconductor material and so on. It should be noted that the above source electrode region and drain electrode region may be regions doped with n-type impurities or p-type impurities.

Figure 4B:
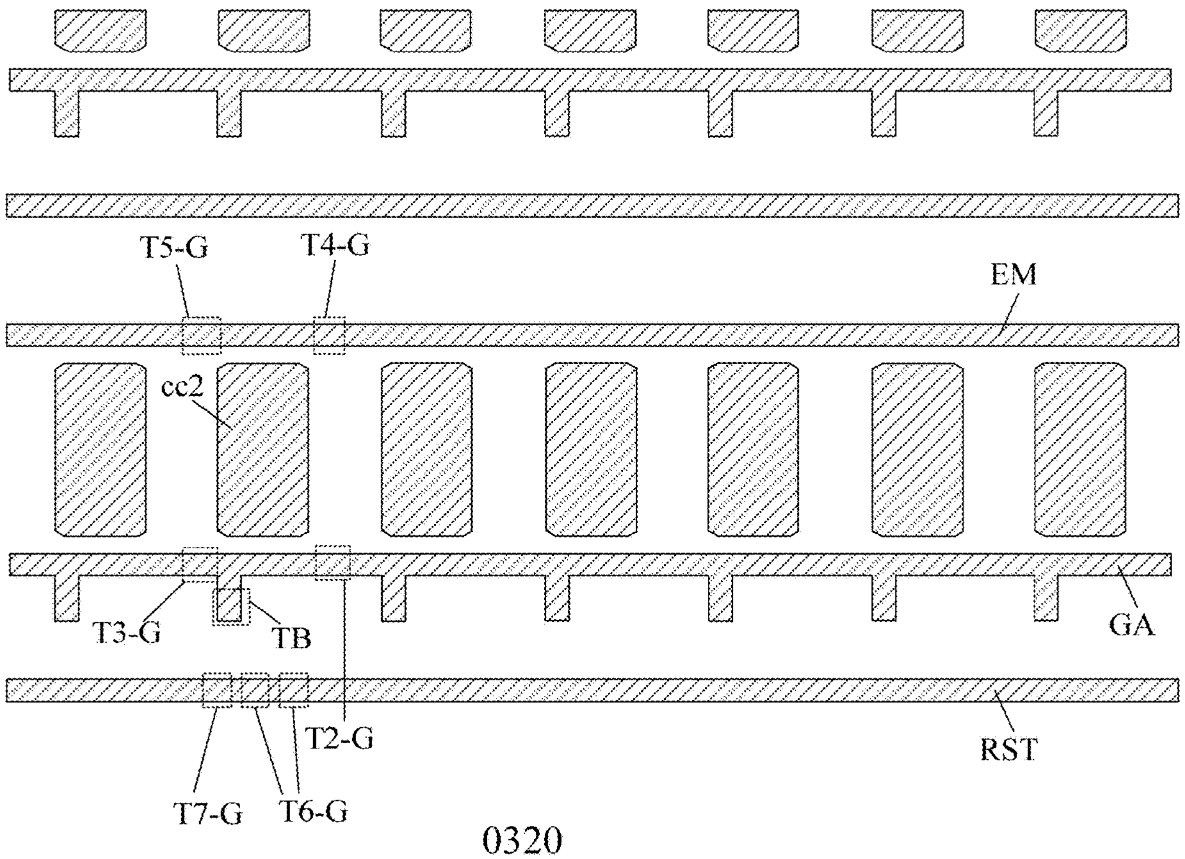
FIG. 4B is a schematic diagram of some gate conductive layers provided by an embodiment of the present disclosure.
Figure 5A:
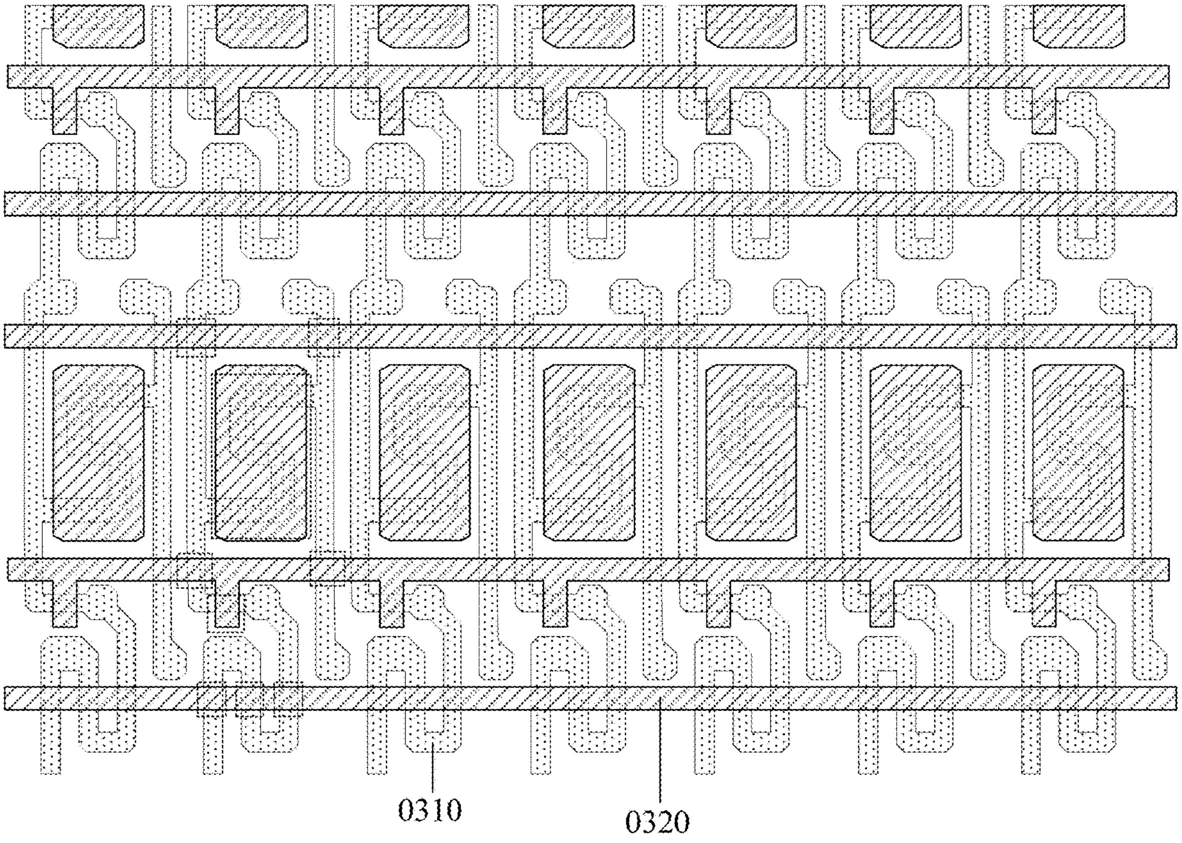
FIG. 5A is some schematic stacking diagrams of an active semiconductor layer and a gate conductive layer provided by an embodiment of the present disclosure.

Exemplarily, a gate insulating layer is formed on the above active semiconductor layer 0310 and used to protect the above active semiconductor layer 0310. FIG. 3, FIG. 4B and FIG. 5A show the gate conductive layer 0320 of the pixel circuit 0121. The gate conductive layer 0320 is disposed on one side of the gate insulating layer facing away from the base substrate 10 so as to be insulated with the active semiconductor layer 0310. The gate conductive layer 0320 may include the second electrode cc2 of the storage capacitor CST, the scanning line GA, the reset line RST, the light-emitting control line EM, a protruding part TB, the gate electrode T2-G of the data write-in transistor T2, the gate electrode T3-G of the threshold compensation transistor T3, the gate electrode T4-G of the light-emitting control transistor T4, the gate electrode T5-G of the conducting control transistor T5, the gate electrode T6-G of the initializing transistor T6 and the gate electrode T7-G of the reset transistor T7. The protruding part TB is formed by the protruding portion of the scanning line GA. One repeating unit corresponds to at least one scanning line GA, at least one reset line RST and at least one light-emitting control line EM. For example, one repeating unit may correspond to one scanning line GA, one reset line RST and one light-emitting control line EM.

For example, as shown in FIG. 4B, the gate electrode T2-G of the data write-in transistor T2 may be a portion of the scanning line GA overlapped with the active semiconductor layer 0310, the gate electrode T4-G of the light-emitting control transistor T4 may be a first portion of the light-emitting control line EM overlapped with the active semiconductor layer 0310, the gate electrode T5-G of the conducting control transistor T5 may be a second portion of the light-emitting control line EM overlapped with the active semiconductor layer 0310, the gate electrode T6-G of the initializing transistor T6 may be a first portion of the reset line RST overlapped with the active semiconductor layer 0310, and the gate electrode T7-G of the reset transistor T7 may be a second portion of the reset line RST overlapped with the active semiconductor layer 0310. The threshold compensation transistor T3 may be a thin film transistor of a double-gate structure, a first gate electrode of the threshold compensation transistor T3 may be a portion of the scanning line GA overlapped with the active semiconductor layer 0310, and a second gate electrode of the threshold compensation transistor T3 may be a portion of the protruding part TB protruding from the scanning line GA overlapped with the active semiconductor layer 0310. As shown in FIG. 3 and FIG. 4B, the second electrode cc2 of the storage capacitor CST is multiplexed as the gate electrode of the driving transistor T1.

It should be noted that all dotted lines in FIG. 5A show all portions of the gate conductive layer 0320 overlapped with the active semiconductor layer 0310.

Exemplarily, as shown in FIG. 3 and FIG. 4B, the scanning line GA, the reset line RST and the light-emitting control line EM are arranged in a first direction F1 and extend roughly in a second direction F2. Exemplarily, an orthographic projection of the scanning line GA on the base substrate 10 is located between an orthographic projection of the reset line RST on the base substrate 10 and an orthographic projection of the light-emitting control line EM on the base substrate 10. Exemplarily, FIG. 3 only illustrates by taking an example that the first direction F1 is a column direction, and the second direction F2 is a row direction. In specific implementation, the first direction F1 may also be the row direction, and the second direction F2 may also be the column direction, which is not limited here.

Exemplarily, in the first direction F1, the second electrode cc2 of the storage capacitor CST is located between the scanning line GA and the light-emitting control line EM. Furthermore, the protruding part TB protruding from the scanning line GA is located on one side of the scanning line GA away from the light-emitting control line EM. The protruding part TB protrudes out of the scanning line GA in a direction opposite to an arrow of the first direction F1.

Figure 4C:
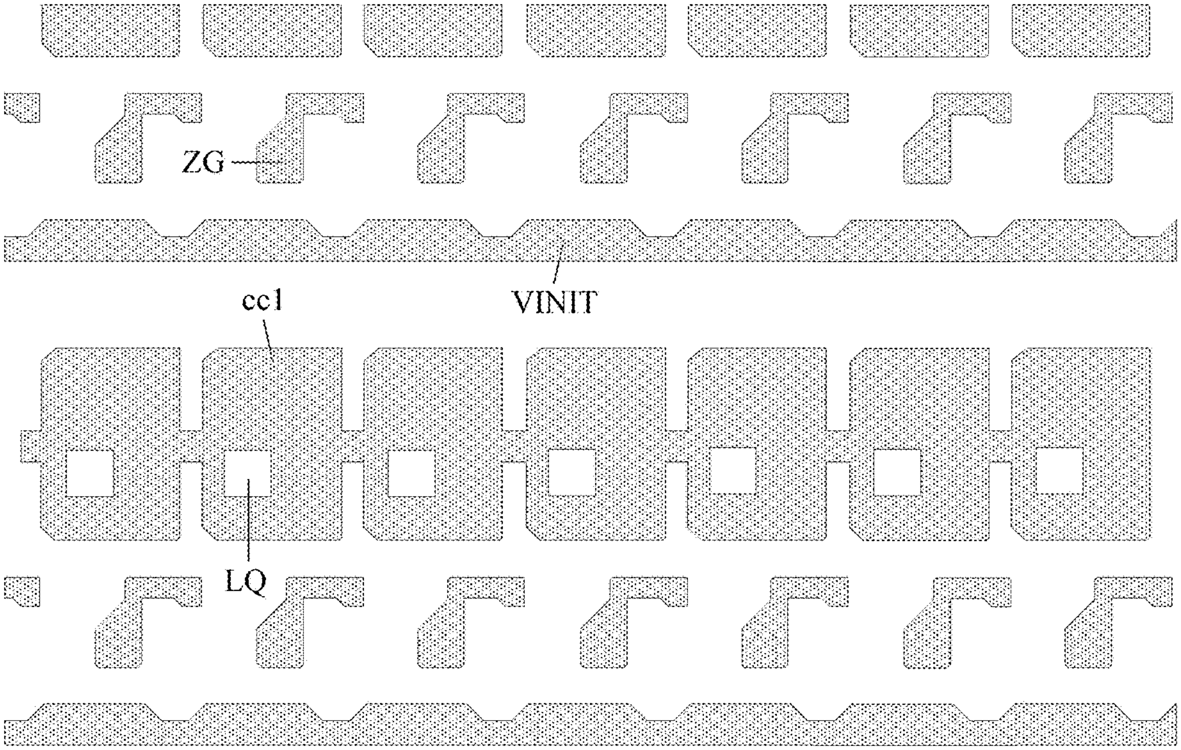
FIG. 4C is a schematic diagram of some reference conductive layers provided by an embodiment of the present disclosure.
Figure 5B:
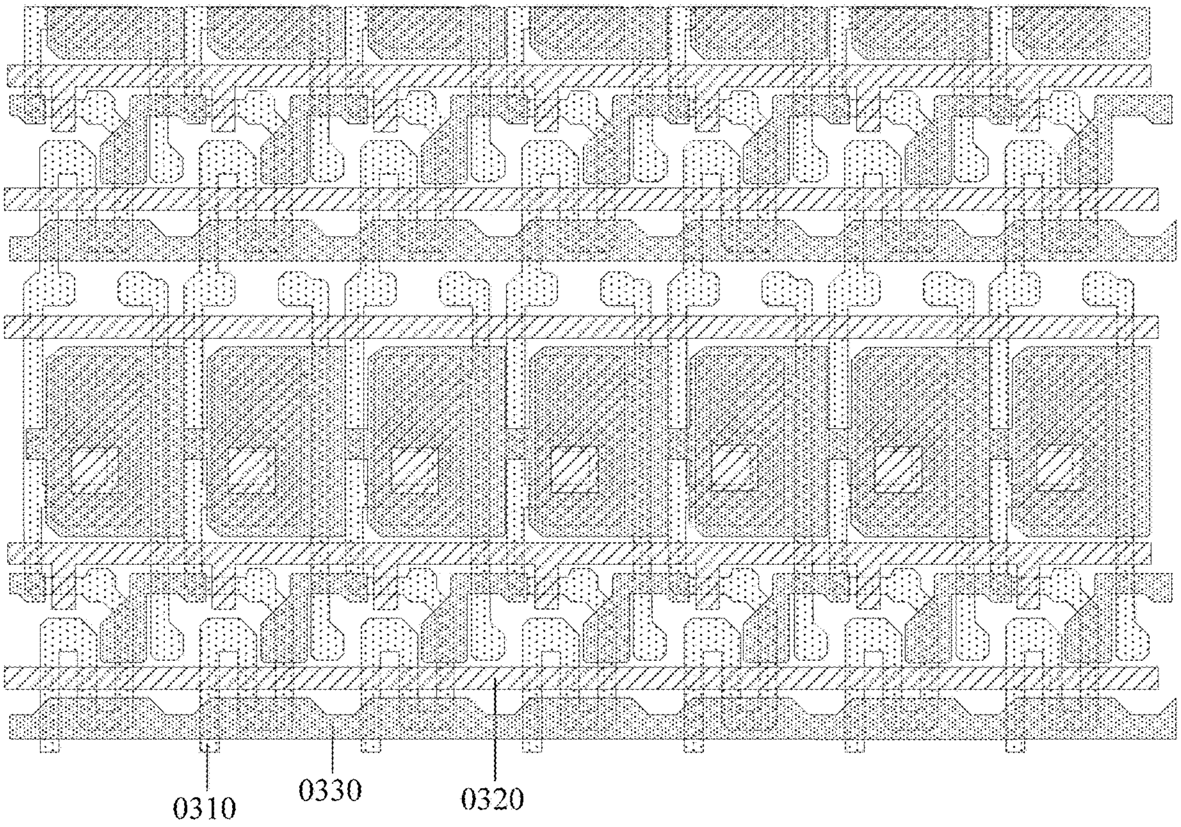
FIG. 5B is some schematic stacking diagrams of an active semiconductor layer, a gate conductive layer and a reference conductive layer provided by an embodiment of the present disclosure.

Exemplarily, an interlayer dielectric layer is formed on the above gate conductive layer 0320 and used to protect the above gate conductive layer 0320. FIG. 3, FIG. 4C and FIG. 5B show the reference conductive layer 0330 of the pixel circuit 121. The reference conductive layer 0330 includes the first electrode cc1 of the storage capacitor CST, the initializing line VINIT and a light shielding layer ZG, wherein the first electrode cc1 of the storage capacitor CST is at least partially overlapped with the second electrode cc2 of the storage capacitor CST so as to form the storage capacitor CST. Exemplarily, the first electrode cc1 of the storage capacitor CST has a hollowed-out region LQ, and an overlapped region may be formed between an orthographic projection of the hollowed-out region LQ on the base substrate 10 and an orthographic projection of the second electrode cc2 of the storage capacitor CST on the base substrate 10.

Exemplarily, as shown in FIG. 3, FIG. 4C and FIG. 5B, an orthographic projection of the light shielding layer ZG on the base substrate 10 is overlapped with an orthographic projection of the drain electrode region (namely, one side of the drain electrode region of the initializing transistor T6 electrically connected with the gate electrode of the driving transistor T1) of the initializing transistor T6 in the active semiconductor layer 0310 on the base substrate 10. In this way, influence of the light on the initializing transistor T6 can be reduced, and reset accuracy is improved.

Exemplarily, as shown in FIG. 3, FIG. 4C and FIG. 5B, the threshold compensation transistor T3 is a double-gate transistor. For example, the light shielding layer ZG shields an active layer portion between the two gate electrodes of the threshold compensation transistor T3. The threshold compensation transistor T3 is directly connected with the driving transistor T1, and therefore, an effect of stabilizing a working state of the driving transistor T1 can be achieved.

Figure 4D:
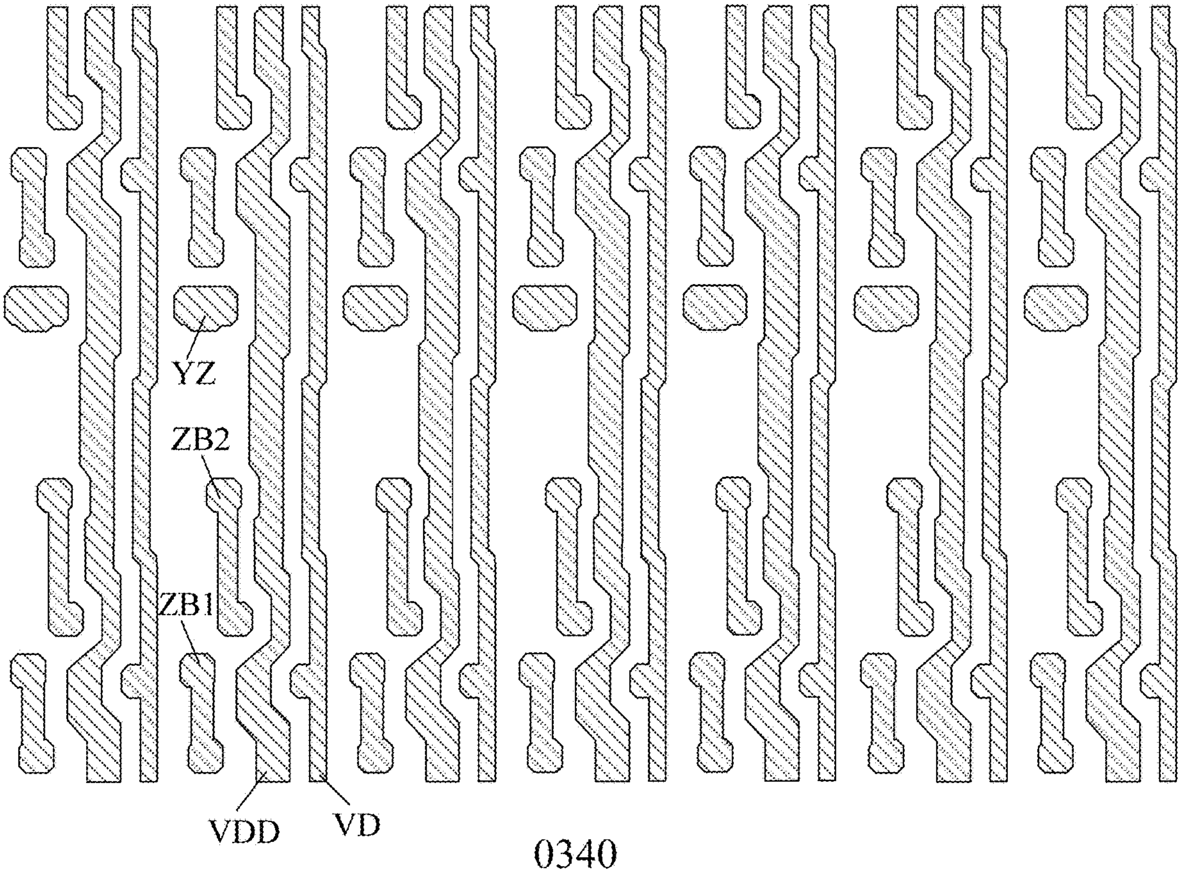
FIG. 4D is a schematic diagram of some source-drain metal layers provided by an embodiment of the present disclosure.
Figure 5C:
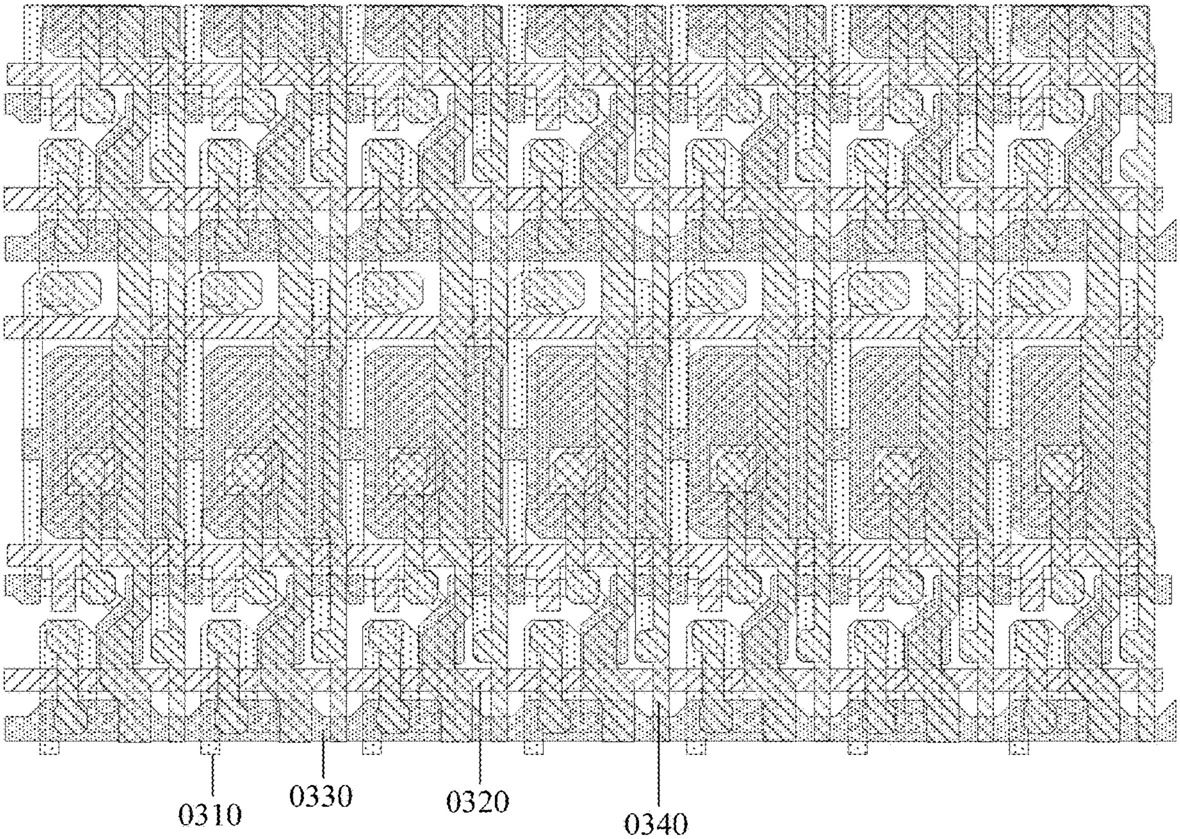
FIG. 5C is some schematic stacking diagrams of an active semiconductor layer, a gate conductive layer, a reference conductive layer and a source-drain metal layer provided by an embodiment of the present disclosure.

Exemplarily, an interlayer insulating layer is formed on the above reference conductive layer 0330 and used to protect the above reference conductive layer 0330. FIG. 3, FIG. 4D and FIG. 5C show the source-drain metal layer 0340 of the pixel circuit 0121. The source-drain metal layer 0340 is located on one side of the interlayer insulating layer facing away from the base substrate 10. The source-drain metal layer 0340 may include the first power signal line VDD, the data line VD, a first transferring part ZB1, a second transferring part ZB2 and an anode transferring part YZ. Exemplarily, all the sub pixels spx each include the first transferring part ZB1, the second transferring part ZB2 and the anode transferring part YZ.

Exemplarily, as shown in FIG. 3, FIG. 4D and FIG. 5C, in the same sub pixel, the anode transferring part YZ is electrically connected with a conductor region of the active layer of the conducting control transistor through a second via hole GK2, wherein the second via hole GK2 penetrates through the interlayer insulating layer, the interlayer dielectric layer and the gate insulating layer.

Exemplarily, as shown in FIG. 3, FIG. 4D and FIG. 5C, a first end of the first transferring part ZB1 is electrically connected with the initializing line VINIT through a through hole TK01, and a second end of the first transferring part ZB1 is electrically connected with a source electrode region (for example, the source electrode region of the initializing transistor T6 in the active semiconductor layer 0310 and a source electrode region of the reset transistor T7 are of an integrated structure) of the initializing transistor T6 in the active semiconductor layer 0310 through a through hole TK02. The through hole TK01 penetrates through the interlayer insulating layer. The through hole TK02 penetrates through the interlayer insulating layer, the interlayer dielectric layer and the gate insulating layer.

Exemplarily, as shown in FIG. 3, FIG. 4D and FIG. 5C, a first end of the second transferring part ZB2 is electrically connected with a drain electrode region (the drain electrode region of the initializing transistor T6 is electrically connected with the gate electrode of the driving transistor) of the initializing transistor T6 in the active semiconductor layer 0310 through a through hole TK03, and a second end of the second transferring part ZB2 is electrically connected with the second electrode cc2 (namely, the gate electrode of the driving transistor) of the storage capacitor CST through a through hole TK04. The through hole TK03 penetrates through the interlayer insulating layer, the interlayer dielectric layer and the gate insulating layer. The through hole TK04 penetrates through the interlayer insulating layer and the interlayer dielectric layer.

Exemplarily, as shown in FIG. 3, FIG. 4D and FIG. 5C, the anode transferring part YZ is electrically connected with a drain electrode region of the second light-emitting control circuit 0124 in the active semiconductor layer 0310 through a second via hole GK2. The second via hole GK2 penetrates through the interlayer insulating layer, the interlayer dielectric layer and the gate insulating layer.

Exemplarily, as shown in FIG. 3, FIG. 4D and FIG. 5C, the data line VD is electrically connected with a source electrode region of the data write-in transistor T2 in the active semiconductor layer 0310 through a through hole TK05. The through hole TK05 penetrates through the interlayer insulating layer, the interlayer dielectric layer and the gate insulating layer.

Exemplarily, as shown in FIG. 3, FIG. 4D and FIG. 5C, the first power signal line VDD is electrically connected with a source electrode region of the light-emitting control transistor T4 in the active semiconductor layer 0310 through a through hole TK06. The through hole TK06 penetrates through the interlayer insulating layer, the interlayer dielectric layer and the gate insulating layer.

Exemplarily, as shown in FIG. 3, FIG. 4D and FIG. 5C, the first power signal line VDD and the data line VD are arranged in the second direction F2 and extend roughly in the first direction. It should be noted that in a practical technique, due to limitation of technique conditions or other factors such as wiring or forming of the via holes, extending directions of the first power signal line VDD and the data line VD only need to roughly meet the above condition, which all fall within the protection scope of the present disclosure.

Exemplarily, an auxiliary insulating layer may further be formed on the above source-drain metal layer 0340 and used to protect the above source-drain metal layer 0340. An auxiliary conductive layer may further be formed on one side of the auxiliary insulating layer facing away from the base substrate 10. In this way, the auxiliary conductive layer may be electrically connected with the first power signal line VDD so as to reduce resistance of the first power signal line VDD.

Figure 4E:
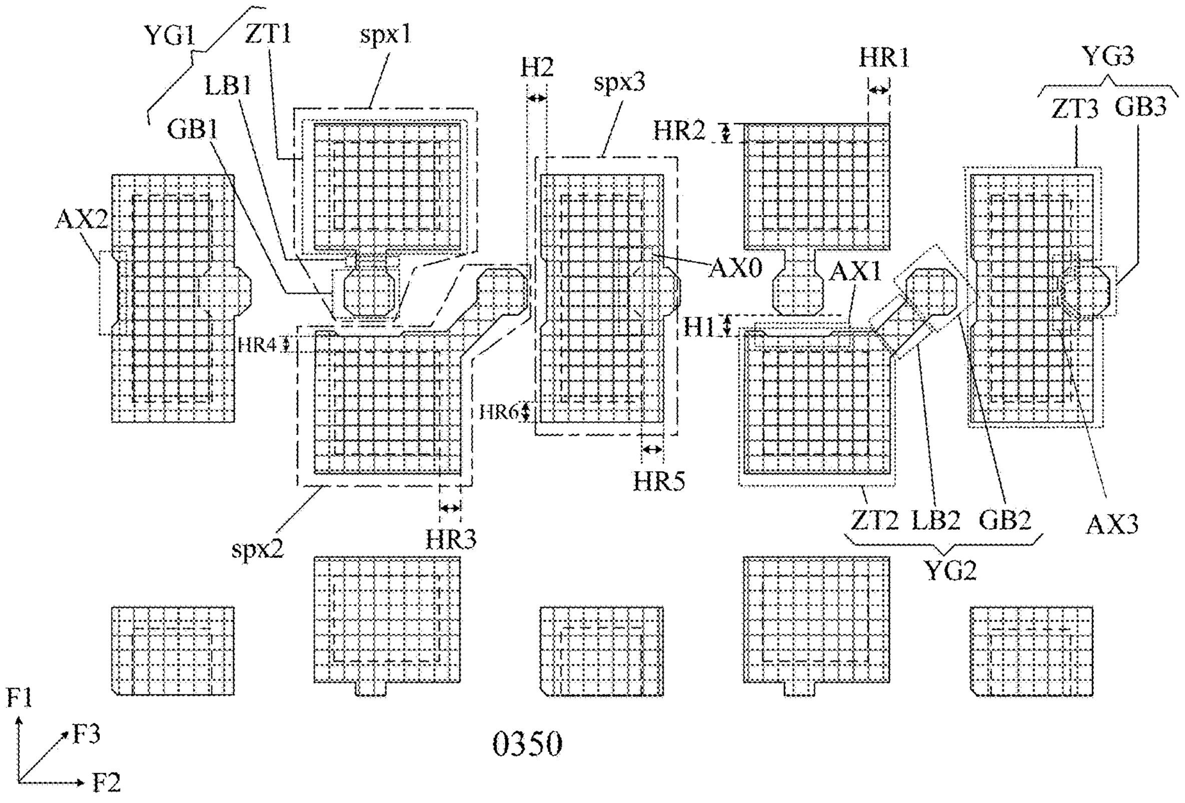
FIG. 4E is a schematic diagram of some first electrode layers provided by an embodiment of the present disclosure.
Figure 5D:
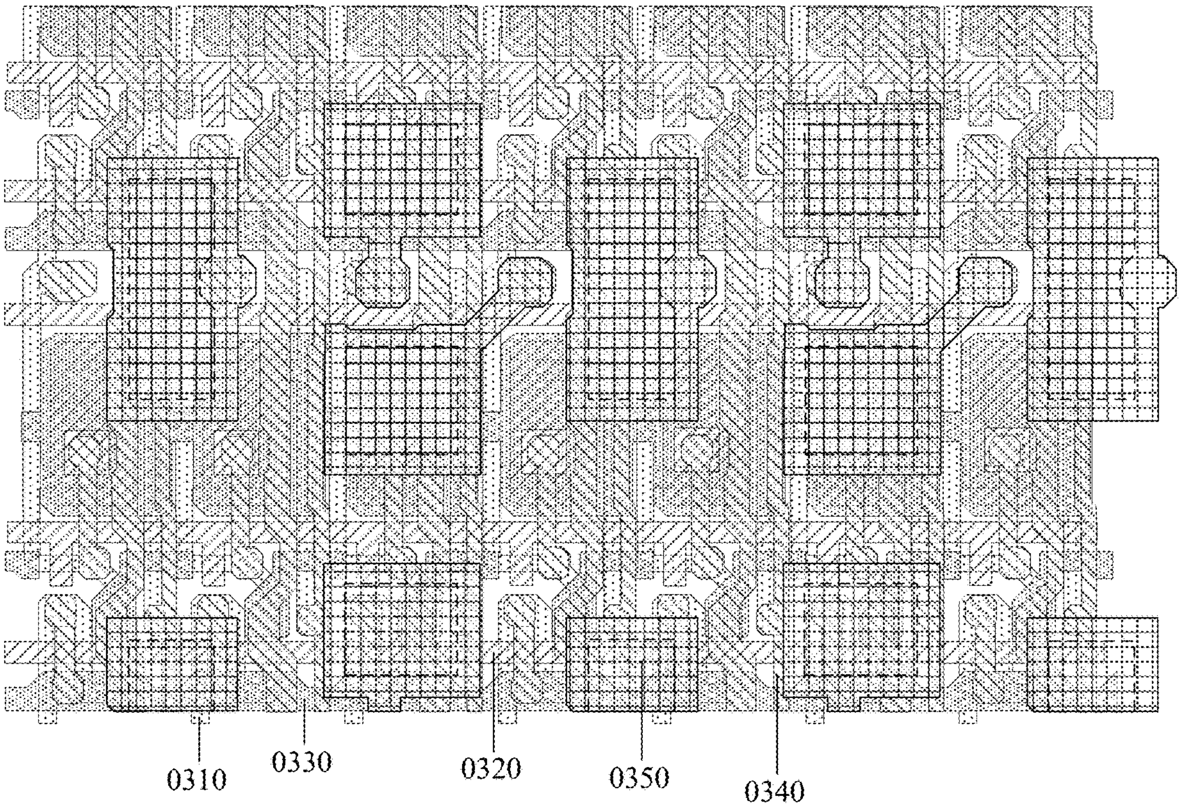
FIG. 5D is some schematic stacking diagrams of an active semiconductor layer, a gate conductive layer, a reference conductive layer, a source-drain metal layer and a supporting layer provided by an embodiment of the present disclosure.

Exemplarily, the first planarization layer is formed on the above source-drain metal layer 0340 and used to protect the above source-drain metal layer 0340. Exemplarily, as shown in FIG. 3, FIG. 4E and FIG. 5D, the first electrode layer is formed on one side of the first planarization layer facing away from the base substrate 10. The first electrode layer includes the anodes located in all the sub pixels, wherein the anodes in all the sub pixels are electrically connected with the anode transferring part YZ through the first via hole GK1, and the first via hole GK1 penetrates through the first planarization layer.

Exemplarily, as shown in FIG. 1 and FIG. 4E, the plurality of sub pixels include first-color sub pixels spx1 and second-color sub pixels spx2 adjacent in the first direction F1, wherein the first-color sub pixels spx1 include anodes YG1, and the second-color sub pixels spx2 include anodes YG2. An orthographic projection of the first via holes GK1 in the first-color sub pixels spx1 on the base substrate 10 is located between an orthographic projection of main body parts ZT1 in the first-color sub pixels spx1 on the base substrate 10 and an orthographic projection of main body parts ZT2 in the second-color sub pixels spx2 on the base substrate 10. Exemplarily, as for the first-color sub pixels spx1 and the second-color sub pixels spx2 adjacent in the first direction F1, a first recess AX1 is formed on one side of an orthographic projection of one edges of the anodes in the second-color sub pixels spx2 on the base substrate 10 facing an orthographic projection of the anodes in the first-color sub pixels spx1 on the base substrate 10, and the first recess AX1 is disposed towards centers of the main body parts ZT2 of the second-color sub pixels spx2. Further, the display panel includes a plurality of repeating units PX. Each repeating unit PX includes at least one first-color sub pixel spx1 and at least one second-color sub pixel spx2. For example, each repeating unit PX includes the first-color sub pixels spx1 and the second-color sub pixels spx2 adjacent in the first direction F1, and the two adjacent repeating units have the two first recesses AX1 and the two first via holes GK1. Furthermore, in the first direction F1, the two first recesses AX1 and the two first via holes GK1 provided by the at least two adjacent repeating units are arranged on the same straight line. For example, the first-color sub pixels spx1 are red sub pixels, the second-color sub pixels spx2 are green sub pixels, and thus the red sub pixels and the green sub pixels are adjacent in the first direction F1. Furthermore, as for the red sub pixels and the green sub pixels adjacent in the first direction F1, the first recess AX1 is formed on one side of an orthographic projection of the anodes in the green sub pixels on the base substrate 10 facing an orthographic projection of the anodes in the red sub pixels on the base substrate 10.

Exemplarily, as shown in FIG. 1 and FIG. 4E, schematic diagrams of layout structures of the pixel circuits included in all the sub pixels are arranged in an array in the first direction and the second direction. That is to say, the layout structures of the pixel circuits included in all the sub pixels are arranged periodically in the row direction and the column direction. Further, the plurality of repeating units PX are arranged in the second direction F2 to form repeating unit groups PXZ, and the repeating unit groups PXZ are arranged in the first direction F1. Furthermore, the repeating units include the first-color sub pixels spx1 and the second-color sub pixels spx2 sequentially arranged in the first direction F1. The first recess AX1 is formed on one side of an orthographic projection of the anodes in the second-color sub pixels spx2 on the base substrate 10 facing the orthographic projection of the anodes in the first-color sub pixels spx1 on the base substrate 10, that is to say, the first recess AX1 is disposed on the main body parts ZT2 in the second-color sub pixels spx2. For example, the first-color sub pixels spx1 are the red sub pixels, the second-color sub pixels spx2 are the green sub pixels, and in the same repeating unit, the first recess AX1 is formed on one side of the orthographic projection of the anodes in the green sub pixels on the base substrate 10 facing the orthographic projection of the anodes in the red sub pixels on the base substrate 10. For example, one repeating unit group PXZ can correspond to one scanning line GA, one reset line RST and one light-emitting control line EM.

Exemplarily, as shown in FIG. 1 and FIG. 4E, the repeating units further include at least one third-color sub pixels spx3. For example, the repeating units may include one third-color sub pixel spx3, wherein connecting lines among the anodes in the adjacent first-color sub pixels spx1, second-color sub pixels spx2 and third-color sub pixels spx3 constitute a triangle. For example, the first-color sub pixels spx1 are the red sub pixels, the second-color sub pixels spx2 are the green sub pixels, the third-color sub pixels spx3 are blue sub pixels, and in the same repeating unit, the connecting lines among the anodes in the red sub pixels, the green sub pixels and the blue sub pixels constitute the triangle.

Exemplarily, as shown in FIG. 3 and FIG. 4E, the anodes may include the main body parts and the via hole parts mutually and electrically connected. An orthographic projection of the via hole parts on the base substrate 10 covers an orthographic projection of the first via hole GK1 on the base substrate 10, and in all the sub pixels, the via hole parts are electrically connected with the anode transferring part YZ through the first via holes GK1. Exemplarily, the anodes YG1 in the first-color sub pixels spx1 may further include first connecting parts LB1 electrically connected between the main body parts ZT1 and the via hole parts GB1, that is, the main body parts ZT1 in the first-color sub pixels spx1 are electrically connected with the via hole parts GB1 through the first connecting parts LB1. The anodes YG2 in the second-color sub pixels spx2 may further include second connecting parts LB2 electrically connected between the main body parts ZT2 and the via hole parts GB2, that is, the main body parts ZT2 in the second-color sub pixels spx2 are electrically connected with the via hole parts GB2 through the second connecting parts LB2. Main body parts ZT3 in the third-color sub pixels spx3 are directly and electrically connected with via hole parts GB3. For example, the first-color sub pixels spx1 are the red sub pixels, and the main body parts in the red sub pixels are electrically connected with the via hole parts through the first connecting parts. The second-color sub pixels spx2 are the green sub pixels, and the main body parts in the green sub pixels are electrically connected with the via hole parts through the second connecting parts. The third-color sub pixels spx3 are the blue sub pixels, and the main body parts in the blue sub pixels are directly and electrically connected with the via hole parts.

Exemplarily, as shown in FIG. 3 and FIG. 4E, the first connecting parts extend in the first direction F1. The second connecting parts extend in a third direction F3, wherein the third direction F3 is different from the first direction F1 and the second direction F2. For example, included angles are formed between the third direction F3 and the first direction F1 as well as between the third direction F3 and the second direction F2 respectively so that the second connecting parts can extend obliquely towards an upper portion.

Exemplarily, as shown in FIG. 3 and FIG. 4E, in the same repeating unit, a second recess AX2 is formed on one side of an orthographic projection of the main body part in the third-color sub pixel spx3 on the base substrate 10 facing an orthographic projection of the first via hole GK1 in the second-color sub pixel spx2 on the base substrate 10. For example, in the same repeating unit, the second recess AX2 is formed on one side of the orthographic projection of the main body part in the third-color sub pixel spx3 on the base substrate 10 facing an orthographic projection of the via hole part GB2 in the second-color sub pixel spx2 on the base substrate 10. For example, the first-color sub pixels spx1 are the red sub pixels, the second-color sub pixels spx2 are the green sub pixels, the third-color sub pixels spx3 are the blue sub pixels, and in the same repeating unit, a second recess AX2 is formed on one side of an orthographic projection of the main body part in the blue sub pixel on the base substrate 10 facing an orthographic projection of the first via hole GK1 in the green sub pixel on the base substrate 10.

Exemplarily, as shown in FIG. 3 and FIG. 4E, in the same repeating unit, the orthographic projection of the first via hole GK1 in the first-color sub pixel spx1 on the base substrate 10 is located between an orthographic projection of the anode YZ1 in the first-color sub pixel spx1 on the base substrate 10 and an orthographic projection of the anode YZ2 in the second-color sub pixel spx2 on the base substrate 10.

Exemplarily, as shown in FIG. 3 and FIG. 4E, in the same repeating unit, the orthographic projection of the first via hole GK1 in the second-color sub pixel spx2 on the base substrate 10 is located between an orthographic projection of the via hole part GB1 in the first-color sub pixel spx1 on the base substrate 10 and an orthographic projection of the main body part ZT3 in the third-color sub pixel spx3 on the base substrate 10. Furthermore, the orthographic projection of the first via holes GK1 in the second-color sub pixels spx2 on the base substrate 10, the orthographic projection of the via hole parts GB1 in the first-color sub pixels spx1 on the base substrate 10 and the orthographic projection of the main body parts ZT3 in the third-color sub pixels spx3 on the base substrate 10 are located on the same straight line, and the straight line may be roughly parallel to the first direction F1.

Exemplarily, as shown in FIG. 3 and FIG. 4E, in the same repeating unit, an orthographic projection of the first via hole GK1 in the third-color sub pixel spx3 is located on one side of an orthographic projection of the second recess AX2 on the base substrate 10 facing away from an orthographic projection of the via hole part GB2 in the second-color sub pixel spx2. For example, the second-color sub pixels spx2 are the green sub pixels, the first-color sub pixels spx1 are the red sub pixels, the third-color sub pixels spx3 are the blue sub pixels, and in the same repeating unit, an orthographic projection of the first via hole GK1 in the red sub pixel is located between the orthographic projection of the anode in the red sub pixel on the base substrate 10 and the orthographic projection of the anode in the green sub pixel on the base substrate 10. The orthographic projection of the first via holes GK1 in the green sub pixels is located between the orthographic projection of the via hole parts in the red sub pixels on the base substrate 10 and the orthographic projection of the main body parts in the blue sub pixels on the base substrate 10. An orthographic projection of the first via holes GK1 in the blue sub pixels on the base substrate 10 is located on one side of the orthographic projection of the second recesses AX2 on the base substrate 10 facing away from an orthographic projection of the via hole parts in the green sub pixels on the base substrate 10.

Exemplarily, as shown in FIG. 3 and FIG. 4E, in the same repeating unit, an overlapped region is at least formed between an orthographic projection of the first recess AX1 of the anode in the second-color sub pixel spx2 in the second direction F2 and an orthographic projection of the first via hole GK1 in the first-color sub pixel spx1 in the second direction F2, wherein the first direction F1 is different from the second direction F2. For example, the first-color sub pixels spx1 are the red sub pixels, the second-color sub pixels spx2 are the green sub pixels, the third-color sub pixels spx3 are the blue sub pixels, and in the same repeating unit, an overlapped region is at least formed between an orthographic projection of the first recess AX1 of the anode in the green sub pixel in the second direction F2 and an orthographic projection of the first via hole GK1 in the red sub pixel in the second direction F2. It should be noted that the orthographic projection in the second direction F2 refers to a line projection of the first recesses AX1 of the anodes in the green sub pixels in a straight line where the second direction F2 is located and a line projection of the first via holes GK1 in the red sub pixels in the straight line where the second direction F2 is located, and lengths of the line projection of the first recesses AX1 of the anodes in the green sub pixels in the straight line where the second direction F2 is located and the line projection of the first via holes GK1 in the red sub pixels in the straight line where the second direction F2 is located are overlapped. In the present application, the orthographic projection in the first direction or the second direction refers to the line projection on a straight line where the first direction or the second direction is located.

Exemplarily, as shown in FIG. 3 and FIG. 4E, in the same repeating unit, an overlapped region is at least formed between an orthographic projection of the second recess AX2 of the main body part in the third-color sub pixel spx3 in the first direction F1 and an orthographic projection of the first via hole GK1 in the second-color sub pixel spx2 in the first direction F1. For example, the first-color sub pixels spx1 are the red sub pixels, the second-color sub pixels spx2 are the green sub pixels, the third-color sub pixels spx3 are the blue sub pixels, and in the same repeating unit, an overlapped region is at least formed between an orthographic projection of the second recess AX2 of the main body part in the blue sub pixel in the first direction F1 and an orthographic projection of the first via hole GK1 in the green sub pixel in the first direction F1.

Exemplarily, as shown in FIG. 3 and FIG. 4E, in the same repeating unit, the orthographic projection of the first recess AX1 of the anode in the second-color sub pixel spx2 in the second direction F2 covers the orthographic projection of the first via hole GK1 in the first-color sub pixel spx1 in the second direction F2. The orthographic projection of the first recesses AX1 of the anodes in the second-color sub pixels spx2 in the second direction F2 covers the orthographic projection of the via hole parts GB1 in the first-color sub pixels spx1 in the second direction F2. For example, the first-color sub pixels spx1 are the red sub pixels, the second-color sub pixels spx2 are the green sub pixels, the third-color sub pixels spx3 are the blue sub pixels, and in the same repeating unit, the orthographic projection of the first recess AX1 of the anode in the green sub pixel in the second direction F2 covers the orthographic projection of the first via hole GK1 in the red sub pixel in the second direction F2.

Exemplarily, as shown in FIG. 3 and FIG. 4E, in the same repeating unit, an orthographic projection of the second recess AX2 of the main body part ZT3 in the third-color sub pixel spx3 in the first direction F1 covers an orthographic projection of the first via hole GK1 in the second-color sub pixel spx2 in the first direction F1. The first-color sub pixels spx1 are the red sub pixels, the second-color sub pixels spx2 are the green sub pixels, the third-color sub pixels spx3 are the blue sub pixels, and in the same repeating unit, an orthographic projection of the second recess AX2 of the main body part in the blue sub pixel in the first direction F1 covers an orthographic projection of the first via hole GK1 in the green sub pixel in the first direction F1.

Exemplarily, as shown in FIG. 3 and FIG. 4E, in the same repeating unit, the orthographic projection of the second recess AX2 of the main body part ZT3 in the third-color sub pixel spx3 in the first direction F1 covers an orthographic projection of the via hole part GB2 in the second-color sub pixel spx2 in the first direction F1. The first-color sub pixels spx1 are the red sub pixels, the second-color sub pixels spx2 are the green sub pixels, the third-color sub pixels spx3 are the blue sub pixels, and in the same repeating unit, an orthographic projection of the second recess AX2 of the main body part in the blue sub pixel in the first direction F1 covers an orthographic projection of the via hole part GB2 in the green sub pixel in the first direction F1.

Exemplarily, as shown in FIG. 3 and FIG. 4E, the main body parts ZT2 in the second-color sub pixels spx2 have the first recesses AX1, and in the same repeating unit, the orthographic projection of the first recesses AX1 in the second direction F2 covers the orthographic projection of the via hole parts in the first-color sub pixels spx1 in the second direction F2. For example, the second-color sub pixels spx2 are the green sub pixels, the first-color sub pixels spx1 are the red sub pixels, the third-color sub pixels spx3 are the blue sub pixels, and thus the main body parts in the green sub pixels have the first recesses AX1. Furthermore, in the same repeating unit, the orthographic projection of the first recesses AX1 in the second direction F2 covers the orthographic projection of the via hole parts in the red sub pixels in the second direction F2.

Exemplarily, as shown in FIG. 3 and FIG. 4E, in the same repeating unit, the orthographic projection of the second recess AX2 of the main body part ZT3 in the third-color sub pixel spx3 in the first direction F1 covers the orthographic projection of the via hole part GB2 in the second-color sub pixel spx2 in the first direction F1. For example, the second-color sub pixels spx2 are the green sub pixels, the first-color sub pixels spx1 are the red sub pixels, the third-color sub pixels spx3 are the blue sub pixels, and thus in the same repeating unit, the orthographic projection of the second recess AX2 of the main body part in the blue sub pixel in the first direction F1 covers the orthographic projection of the via hole part in the green sub pixel in the first direction F1.

Exemplarily, as shown in FIG. 3 and FIG. 4E, an edge of the orthographic projection of the first recesses AX1 on the base substrate 10 is roughly parallel to an edge of the orthographic projection of the via hole parts GB1 in the first-color sub pixels spx1 on the base substrate 10. For example, the second-color sub pixels spx2 are the green sub pixels, the first-color sub pixels spx1 are the red sub pixels, the third-color sub pixels spx3 are the blue sub pixels, and in the same repeating unit, the edge of the orthographic projection of the first recess AX1 on the base substrate 10 is roughly parallel to an edge of the orthographic projection of the via hole part in the red sub pixel on the base substrate 10. It should be noted that in the practical technique, due to limitation of the technique conditions or other factors such as wiring or forming of the via holes, the above parallel relationship only needs to roughly meet the above condition, which all fall within the protection scope of the present disclosure.

Exemplarily, as shown in FIG. 3 and FIG. 4E, an edge of the orthographic projection of the second recesses AX2 on the base substrate 10 is roughly parallel to an edge of the orthographic projection of the main body parts ZT2 in the second-color sub pixels spx2 on the base substrate 10. For example, the second-color sub pixels spx2 are the green sub pixels, the first-color sub pixels spx1 are the red sub pixels, the third-color sub pixels spx3 are the blue sub pixels, and in the same repeating unit, the edge of the orthographic projection of the second recess AX2 on the base substrate 10 is roughly parallel to the edge of the orthographic projection of the main body part in the green sub pixel on the base substrate 10. It should be noted that in the practical technique, due to limitation of the technique conditions or other factors such as wiring or forming of the via holes, the above parallel relationship only needs to roughly meet the above condition, which all fall within the protection scope of the present disclosure.

Exemplarily, as shown in FIG. 3 and FIG. 4E, a first distance between the edge of the orthographic projection of the first recesses AX1 on the base substrate 10 and the edge of the orthographic projection of the via hole parts GB1 in the first-color sub pixels spx1 on the base substrate 10 is not less than 2.5 μm. For example, the second-color sub pixels spx2 are the green sub pixels, the first-color sub pixels spx1 are the red sub pixels, the third-color sub pixels spx3 are the blue sub pixels, and a first distance between the edge of the orthographic projection of the first recesses AX1 on the base substrate 10 and the edge of the orthographic projection of the via hole parts in the red sub pixels on the base substrate 10 is not less than 2.5 μm. For example, the first distance between the edge of the orthographic projection of the first recesses AX1 on the base substrate 10 and the edge of the orthographic projection of the via hole parts in the red sub pixels on the base substrate 10 is not less than 2.5-20 μm. For example, the first distance may be set to be 2.5 μm. Alternatively the first distance may also be set to be 3.5 μm, or the first distance may also be set to be 5.5 μm, or the first distance may also be set to be 10 μm, or the first distance may also be set to be 20 μm. In the practical application, the first distance may be set to be 3.5 μm when the display panel is produced in batches in combination with a preparation technique and device precision. Certainly, in the practical application, a numeric value of the first distance can be set according to demands of the practical application, which is not limited here.

Exemplarily, as shown in FIG. 3 and FIG. 4E, a second distance between the edge of the orthographic projection of the second recesses AX2 on the base substrate 10 and the edge of the orthographic projection of the main body parts ZT2 in the second-color sub pixels spx2 on the base substrate 10 is not less than 2.5 μm. For example, the second distance between the edge of the orthographic projection of the second recesses AX2 on the base substrate 10 and the edge of the orthographic projection of the main body parts ZT2 in the second-color sub pixels spx2 on the base substrate 10 is 2.5-20 μm. For example, the second-color sub pixels spx2 are the green sub pixels, the first-color sub pixels spx1 are the red sub pixels, the third-color sub pixels spx3 are the blue sub pixels, and a second distance between the edge of the orthographic projection of the second recesses AX2 on the base substrate 10 and the edge of the orthographic projection of the main body parts in the green sub pixels on the base substrate 10 is not less than 2.5 μm. Further, the second distance is 2.5-20 μm, and may be set to be 2.5 μm. Alternatively the second distance may also be set to be 3.5 μm, or the second distance may also be set to be 5.5 μm, or the first distance may also be set to be 10 μm, or the first distance may also be set to be 20 μm. In the practical application, the second distance may be set to be 3.5 μm when the display panel is produced in batches in combination with the preparation technique and device precision. Certainly, in the practical application, a numeric value of the second distance can be set according to the demands of the practical application, which is not limited here.

Exemplarily, as shown in FIG. 3 and FIG. 4E, the transistor array layer includes the driving transistors located in all the sub pixels. The first-color sub pixels spx1 are the red sub pixels, the second-color sub pixels spx2 are the green sub pixels, the third-color sub pixels spx3 are the blue sub pixels, and an overlapped region is formed between the orthographic projection of the anodes in the green sub pixels on the base substrate 10 and an orthographic projection of the channel regions of the driving transistors in the red sub pixels on the base substrate 10. The orthographic projection of the anodes in the red sub pixels on the base substrate 10 does not overlap with an orthographic projection of the channel regions of all the driving transistors on the base substrate 10. Exemplarily, an overlapped region is formed between the orthographic projection of the anodes in the red sub pixels on the base substrate 10 and an orthographic projection of the pixel circuit in the red sub pixels on the base substrate 10.

Exemplarily, as shown in FIG. 1, FIG. 3 and FIG. 4E, one repeating unit corresponds to one scanning line GA, one reset line RST and one light-emitting control line EM. Further, one repeating unit group PXZ corresponds to one scanning line GA, one reset line RST and one light-emitting control line EM, that is to say, the pixel circuit in one repeating unit group PXZ is electrically connected with the same scanning line GA, the same reset line RST and the same light-emitting control line EM. As for the scanning line GA, the reset line RST and the light-emitting control line EM corresponding to the same repeating unit, the orthographic projection of the scanning line GA on the base substrate 10 is located between the orthographic projection of the reset line RST on the base substrate 10 and the orthographic projection of the light-emitting control line EM on the base substrate 10. For example, as for the scanning line GA, the reset line RST and the light-emitting control line EM corresponding to the same repeating unit group, the orthographic projection of the scanning line GA on the base substrate 10 is located between the orthographic projection of the reset line RST on the base substrate 10 and the orthographic projection of the light-emitting control line EM on the base substrate 10.

Exemplarily, as shown in FIG. 1, FIG. 3 and FIG. 4E, in the same repeating unit, the orthographic projection of the reset line RST on the base substrate 10 does not overlap with the orthographic projection of the anode in the red sub pixel controlled by the reset line RST on the base substrate 10, an overlapped region is formed between the orthographic projection of the light-emitting control line EM on the base substrate 10 and the orthographic projection of the anode in the green sub pixel controlled by the light-emitting control line EM on the base substrate 10, and the orthographic projection of the scanning line GA on the base substrate 10 does not overlap with the orthographic projection of all the anodes controlled by the scanning line GA on the base substrate 10. Further, in the same repeating unit group PXZ, the orthographic projection of the reset line RST on the base substrate 10 does not overlap with the orthographic projection of the anode in the red sub pixel controlled by the reset line RST on the base substrate 10, the overlapped region is formed between the orthographic projection of the light-emitting control line EM on the base substrate 10 and the orthographic projection of the anode in the green sub pixel controlled by the light-emitting control line EM on the base substrate 10, and the orthographic projection of the scanning line GA on the base substrate 10 does not overlap with the orthographic projection of all the anodes controlled by the scanning line GA on the base substrate 10. Further, as for the same repeating unit, overlapped regions are formed between the orthographic projection of the light-emitting control line EM for controlling the repeating unit on the base substrate 10 and the orthographic projection of the anode in the blue sub pixel on the base substrate 10 as well as between the orthographic projection of the light-emitting control line EM for controlling the repeating unit on the base substrate 10 and the orthographic projection of the anode in the green sub pixel on the base substrate 10 respectively, and the orthographic projections of both the reset line RST and the scanning line GA for controlling the repeating unit on the base substrate 10 do not overlap with the orthographic projection of all the anodes on the base substrate 10. It should be noted that the reset line RST is a signal line for controlling the initializing transistor T6 and the reset transistor T7 in one repeating unit. The light-emitting control line EM is a signal line for controlling the light-emitting control transistor T4 and the conducting control transistor T5 in one repeating unit. The scanning line GA is a signal line for controlling the data write-in transistor T2 and the threshold compensation transistor T3 in one repeating unit. For example, as for one repeating unit group PXZ, overlapped regions are formed between the orthographic projection of the light-emitting control line EM for controlling the repeating unit group PXZ on the base substrate 10 and the orthographic projection of the anode in the blue sub pixel on the base substrate 10 as well as between the orthographic projection of the light-emitting control line EM for controlling the repeating unit group PXZ on the base substrate 10 and the orthographic projection of the anode in the green sub pixel on the base substrate 10 respectively, and the orthographic projections of both the reset line RST and the scanning line GA for controlling the repeating unit group PXZ on the base substrate 10 do not overlap with the orthographic projection of all the anodes on the base substrate 10. It should be noted that the reset line RST is a signal line for controlling the initializing transistor T6 and the reset transistor T7 in one repeating unit group. The light-emitting control line EM is a signal line for controlling the light-emitting control transistor T4 and the conducting control transistor T5 in one repeating unit group. The scanning line GA is a signal line for controlling the data write-in transistor T2 and the threshold compensation transistor T3 in one repeating unit group.

Exemplarily, as shown in FIG. 1, FIG. 3 and FIG. 4E, the overlapped region is formed between the orthographic projection of the reset lines on the base substrate 10 and the orthographic projection of the anodes in the red sub pixels on the base substrate 10, the overlapped region is formed between the orthographic projection of the light-emitting control lines on the base substrate 10 and the orthographic projection of the anodes in the green sub pixels on the base substrate 10, and the orthographic projection of the scanning lines on the base substrate 10 does not overlap with the orthographic projection of all the anodes on the base substrate 10.

Exemplarily, as shown in FIG. 3 and FIG. 4E, in the same repeating unit, overlapped regions are formed between an orthographic projection of the anodes in the third-color sub pixels spx3 on the base substrate 10 and an orthographic projection of the reset lines for controlling the pixel circuits in the third-color sub pixels spx3 on the base substrate 10 as well as between the orthographic projection of the anodes in the third-color sub pixels spx3 on the base substrate 10 and an orthographic projection of the light-emitting control lines for controlling the pixel circuits in the third-color sub pixels spx3 on the base substrate 10. For example, the first-color sub pixels spx1 are the red sub pixels, the second-color sub pixels spx2 are the green sub pixels, the third-color sub pixels spx3 are the blue sub pixels, and in the same repeating unit, the overlapped regions are formed between the orthographic projection of the anode in the blue sub pixel on the base substrate 10 and the orthographic projection of the reset line on the base substrate 10 as well as between the orthographic projection of the anode in the blue sub pixel on the base substrate 10 and the orthographic projection of the light-emitting control line on the base substrate 10 respectively.

Exemplarily, as shown in FIG. 3 and FIG. 4E, a first overlapped region is formed between the orthographic projection of the first via holes GK1 in the red sub pixels on the base substrate 10 and the orthographic projection of the second via holes GK2 in the red sub pixels on the base substrate 10. A second overlapped region is formed between the orthographic projection of the first via holes GK1 in the green sub pixels on the base substrate 10 and the orthographic projection of the second via holes GK2 in the green sub pixels on the base substrate 10. A third overlapped region is formed between the orthographic projection of the first via holes GK1 in the blue sub pixels on the base substrate 10 and the orthographic projection of the second via holes GK2 in the blue sub pixels on the base substrate 10. An area of the first overlapped region is not greater than an area of the second overlapped region. The area of the first overlapped region is not greater than an area of the third overlapped region. Further, the area of the third overlapped region may be roughly equal to the area of the second overlapped region. It should be noted that in the practical technique, due to limitation of the technique conditions or other factors such as wiring or forming of the via holes, an above equal relationship only needs to roughly meet the above condition, which all fall within the protection scope of the present disclosure.

Exemplarily, the area of the first overlapped region is 0-0.9 μm. For example, the area of the first overlapped region may also be 0.5 μm, or the area of the first overlapped region may also be 0.9 μm, or the area of the first overlapped region may also be 0 μm. In this way, the orthographic projection of the first via holes GK1 in the red sub pixels on the base substrate 10 may not overlap with the orthographic projection of the second via holes GK2 in the red sub pixels on the base substrate 10.

Exemplarily, the area of the second overlapped region is 0-0.9 μm. For example, the area of the second overlapped region may also be 0.5 μm, or the area of the second overlapped region may also be 0.9 μm, or the area of the second overlapped region may also be 0 μm. In this way, the orthographic projection of the first via holes GK1 in the green sub pixels on the base substrate 10 may not overlap with the orthographic projection of the second via holes GK2 in the green sub pixels on the base substrate 10.

Exemplarily, the area of the third overlapped region is 0-0.9 μm. For example, the area of the third overlapped region may also be 0.5 μm, or the area of the third overlapped region may also be 0.9 μm, or the area of the third overlapped region may also be 0 μm. In this way, the orthographic projection of the first via holes GK1 in the blue sub pixels on the base substrate 10 may not overlap with the orthographic projection of the second via holes GK2 in the blue sub pixels on the base substrate 10.

Exemplarily, when the first-color sub pixels spx1 are the red sub pixels, the second-color sub pixels spx2 are the green sub pixels, the third-color sub pixels spx3 are the blue sub pixels, the second overlapped region may be arranged to be greater so as to ensure a distance between the anodes in the blue sub pixels and the anodes in the green sub pixels to avoid color mixing.

Exemplarily, as shown in FIG. 3 and FIG. 4E, the first via holes GK1 in the repeating units adjacent in the second direction F2 are roughly and sequentially arranged in the second direction F2. For example, the first via holes GK1 in the repeating unit groups are roughly and sequentially arranged in the second direction F2. Exemplarily, the orthographic projections of the first via holes GK1 in the repeating units adjacent in the second direction F2 in the first direction F1 are overlapped. For example, the orthographic projections of the first via holes GK1 in the repeating unit groups in the first direction F1 are overlapped. It should be noted that in the practical technique, due to limitation of the technique conditions or other factors such as wiring or forming of the via holes, an arrangement relationship of the first via holes GK1 only needs to roughly meet the above condition, which all fall within the protection scope of the present disclosure.

Figure 4F:
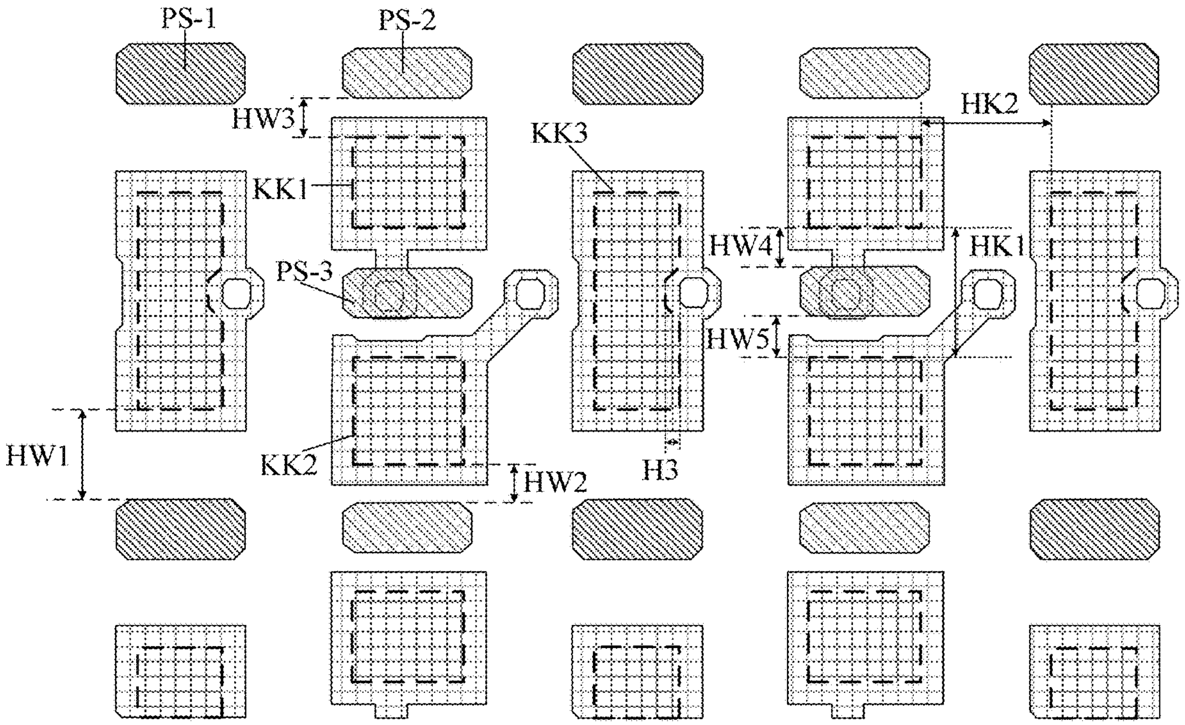
FIG. 4F is a schematic diagram of some first electrode layers and supporting layers provided by an embodiment of the present disclosure.
Figure 4G:
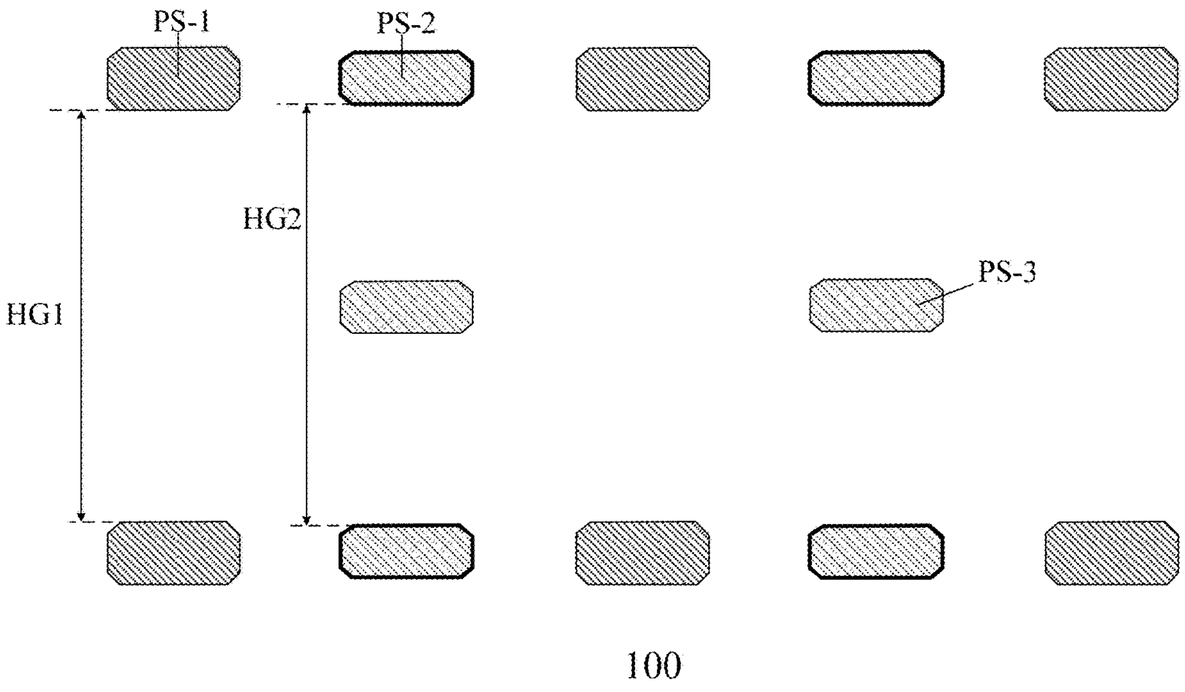
FIG. 4G is a schematic diagram of some supporting layers provided by an embodiment of the present disclosure.

Exemplarily, as shown in FIG. 3, FIG. 4E and FIG. 4F, the pixel defining layer is formed on one side of the first electrode layer facing away from the base substrate 10. The pixel defining layer includes openings located in all the sub pixels, and in the same sub pixel, an orthographic projection of the opening on the base substrate 10 is located in the orthographic projection of the anode on the base substrate 10. For example, the first-color sub pixels spx1 are the red sub pixels, the second-color sub pixels spx2 are the green sub pixels, the third-color sub pixels spx3 are the blue sub pixels, the red sub pixels have openings KK1, the green sub pixels have openings KK2, and the blue sub pixels have openings KK3. It should be noted that a region where the openings in all the sub pixels are located is equivalent to a light emitting region of the sub pixels.

Exemplarily, as shown in FIG. 3, FIG. 4E and FIG. 4F, in at least one sub pixel in the first-color sub pixels spx1 and the second-color sub pixels spx2, the orthographic projection of the opening on the base substrate 10 is rectangular. For example, both the orthographic projection of the openings in the first-color sub pixels spx1 on the base substrate 10 and the orthographic projection of the openings in the second-color sub pixels spx2 on the base substrate 10 are rectangular. For example, the first-color sub pixels spx1 are the red sub pixels, the second-color sub pixels spx2 are the green sub pixels, the third-color sub pixels spx3 are the blue sub pixels, and both the orthographic projection of the openings KK1 in the red sub pixels on the base substrate 10 and the orthographic projection of the openings KK2 in the green sub pixels on the base substrate 10 are rectangular.

Exemplarily, as shown in FIG. 3, FIG. 4E and FIG. 4F, an area of the openings in the third-color sub pixels spx3 is greater than an area of the openings in the second-color sub pixels spx2, and the area of the openings in the second-color sub pixels spx2 is greater than an area of the openings in the first-color sub pixels spx1. For example, the first-color sub pixels spx1 are the red sub pixels, the second-color sub pixels spx2 are the green sub pixels, the third-color sub pixels spx3 are the blue sub pixels, an area of the openings KK3 in the blue sub pixels is greater than an area of the openings KK2 in the green sub pixels, and the area of the openings KK2 in the green sub pixels is greater than an area of the openings KK1 in the red sub pixels. In the practical application, the areas of the openings in all the sub pixels may be inversely proportional to a light-emitting lifetime of the sub pixels. For example, the light-emitting lifetime of the red sub pixels is greater than the light-emitting lifetime of the green sub pixels and the light-emitting lifetime of the blue sub pixels, thus the area of the openings in the blue sub pixels may be greater than the area of the openings in the green sub pixels, and the area of the openings in the green sub pixels may be greater than the area of the openings in the red sub pixels.

Exemplarily, as shown in FIG. 3, FIG. 4E and FIG. 4F, in the third-color sub pixels spx3, an opening recess AX0 is formed on one side of the orthographic projection of the openings on the base substrate 10 facing the orthographic projection of the first via holes GK1 in the third-color sub pixels spx3 on the base substrate 10. For example, the first-color sub pixels spx1 are the red sub pixels, the second-color sub pixels spx2 are the green sub pixels, the third-color sub pixels spx3 are the blue sub pixels, and in the blue sub pixels, the opening recess AX0 is formed on one side of the orthographic projection of the openings KK3 on the base substrate 10 facing the orthographic projection of the first via holes GK1 on the base substrate 10. By arranging the opening recess AX0, a required area can be fanned out for the first via holes GK1, so as to ensure that anode flatness in the openings KK3 is high, and improve a display effect.

Exemplarily, as shown in FIG. 3, FIG. 4E and FIG. 4F, in the third-color sub pixels spx3, an orthographic projection of the opening recess AX0 in the first direction F1 covers the orthographic projection of the first via holes GK1 in the first direction F1. For example, the first-color sub pixels spx1 are the red sub pixels, the second-color sub pixels spx2 are the green sub pixels, the third-color sub pixels spx3 are the blue sub pixels, and in the blue sub pixels, the orthographic projection of the opening recess AX0 in the first direction F1 covers the orthographic projection of the first via holes GK1 in the first direction F1.

Exemplarily, as shown in FIG. 3, FIG. 4E and FIG. 4F, in the third-color sub pixels spx3, an edge of an orthographic projection of the opening recess AX0 on the base substrate 10 is roughly parallel to the edge of the orthographic projection of the first via holes GK1 on the base substrate 10. For example, the first-color sub pixels spx1 are the red sub pixels, the second-color sub pixels spx2 are the green sub pixels, the third-color sub pixels spx3 are the blue sub pixels, and in the blue sub pixels, the edge of the orthographic projection of the opening recess AX0 on the base substrate 10 is roughly parallel to the edge of the orthographic projection of the first via holes GK1 on the base substrate 10. It should be noted that in the practical technique, due to limitation of the technique conditions or other factors such as wiring or forming of the via holes, the above parallel relationship only needs to roughly meet the above condition, which all fall within the protection scope of the present disclosure.

Exemplarily, as shown in FIG. 3, FIG. 4E and FIG. 4F, in the third-color sub pixels spx3, a third distance between the edge of the orthographic projection of the opening recess AX0 on the base substrate 10 and the edge of the orthographic projection of the first via holes GK1 on the base substrate 10 is not less than 2.25 μm. Further, the third distance is 2.25-20 μm. For example, the first-color sub pixels spx1 are the red sub pixels, the second-color sub pixels spx2 are the green sub pixels, the third-color sub pixels spx3 are the blue sub pixels, and in the blue sub pixels, the third distance between the edge of the orthographic projection of the opening recess AX0 on the base substrate 10 and the edge of the orthographic projection of the first via holes GK1 on the base substrate 10 is not less than 2.25 μm. Exemplarily, the third distance may be set to be 2.25 μm. Alternatively the third distance may also be set to be 2.5 μm. Alternatively the third distance may also be set to be 20 μm. In the practical application, the third distance may be set to be 2.5 μm when the display panel is produced in batches in combination with the preparation technique and the device precision. Certainly, in the practical application, a numeric value of the third distance can be set according to the demands of the practical application, which is not limited here.

Exemplarily, as shown in FIG. 3, FIG. 4E and FIG. 4F, in the third-color sub pixels spx3, a third recess AX3 is formed on one side of the orthographic projection of the main body parts ZT3 of the anodes YG3 on the base substrate 10 facing the orthographic projection of the first via holes GK1 of the anodes YG3 of the third-color sub pixels spx3 on the base substrate 10, and the third recess AX3 is roughly parallel to the opening recess AX0. For example, the first-color sub pixels spx1 are the red sub pixels, the second-color sub pixels spx2 are the green sub pixels, the third-color sub pixels spx3 are the blue sub pixels, and in the blue sub pixels, the third recess AX3 is formed on one side of the orthographic projection of the main body parts ZT3 of the anodes YG3 on the base substrate 10 facing the orthographic projection of the first via holes GK1 of the anodes YG3 of the third-color sub pixels spx3 on the base substrate 10, and the third recess AX3 is roughly parallel to the opening recesses AX0.

Exemplarily, as shown in FIG. 3, FIG. 4E and FIG. 4F, in the third-color sub pixels spx3, an edge of the orthographic projection of the third recess AX3 on the base substrate 10 is overlapped with the edge of the orthographic projection of the opening recess AX0 on the base substrate 10. For example, the first-color sub pixels spx1 are the red sub pixels, the second-color sub pixels spx2 are the green sub pixels, the third-color sub pixels spx3 are the blue sub pixels, and in the blue sub pixels, the edge of the orthographic projection of the third recess AX3 on the base substrate 10 is overlapped with the edge of the orthographic projection of the opening recess AX0 on the base substrate 10.

Exemplarily, as shown in FIG. 3, FIG. 4E, FIG. 4F and FIG. 4G, the supporting layer 100 may include a plurality of columns of first spacers PS-1 and a plurality of columns of second spacers PS-2. The first spacers PS-1 and the second spacers PS-2 are located on the different columns, one column of the first spacers PS-1 corresponds to one column of the sub pixels, and one column of the second spacers PS-2 corresponds to the other column of the sub pixels. The number of the sub pixels in the columns where the first spacers PS-1 are located is different from the number of the sub pixels in the columns where the second spacers PS-2 are located. Exemplarily, one column of the first spacers PS-1 corresponds to the anodes in one column of the sub pixels, and one column of the second spacers PS-2 corresponds to the anodes in the other column of the sub pixels. Furthermore, the number of the anodes in the columns where the first spacers PS-1 are located is different from the number of the anodes in the columns where the second spacers PS-2 are located.

Exemplarily, as shown in FIG. 3, FIG. 4E, FIG. 4F and FIG. 4G, the anode of the at least one sub pixel in the sub pixels corresponding to the first spacers PS-1 extends in the first direction F1 (for example, the column direction), and the first spacers PS-1 and the second spacers PS-2 extend in the second direction F2 (for example, the row direction) respectively. Exemplarily, the anode of the at least one sub pixel in the sub pixels corresponding to the first spacers PS-1 extends in the column direction (namely, the first direction F1), and the first spacers PS-1 and the second spacers PS-2 extend in the row direction (namely, the second direction F2) respectively. Furthermore, as for the sub pixels corresponding to the first spacers PS-1, the first spacers PS-1 in the column direction and the sub pixels are arranged alternately and repeatedly in the column direction (namely, the first direction F1) and correspond in a one-to-one mode.

Exemplarily, as shown in FIG. 3, FIG. 4E, FIG. 4F and FIG. 4G, an orthographic projection of the first spacers PS-1 in the column direction (namely, the first direction F1) does not overlap with an orthographic projection of the anodes in all the sub pixels in the column direction (namely, the first direction F1).

Exemplarily, as shown in FIG. 3, FIG. 4E, FIG. 4F and FIG. 4G, a first ratio is formed between an area (for example, an area of an orthographic projection of the first spacers PS-1 on the base substrate 10) of the first spacers PS-1 and an area (for example, an area of the orthographic projection of the openings of the sub pixels on the base substrate 10) of the openings of the corresponding sub pixels, and a second ratio is formed between an area (for example, an area of an orthographic projection of the second spacers PS-2 on the base substrate 10) of the second spacers PS-2 and an area sum (for example, an area sum of the orthographic projection of the openings of all the sub pixels between the two second spacers PS-2 adjacent in the column direction on the base substrate 10) of the openings of all the sub pixels between the two second spacers PS-2 adjacent in the column direction. The first ratio may be different from the second ratio. Exemplarily, the first ratio may be greater than the second ratio. The first ratio is a value after the area of the first spacers PS-1 is divided by the area of the openings of the corresponding sub pixels. The second ratio is a value after the area of the second spacers PS-2 is divided by the area sum of the openings of all the sub pixels between the two second spacers PS-2 adjacent in the column direction.

Exemplarily, as shown in FIG. 3, FIG. 4E, FIG. 4F and FIG. 4G, a first ratio is formed between the area of the first spacers PS-1 and an area of the openings KK3 in the third-color sub pixels spx3. That is, the first ratio is a value after the area of the first spacers PS-1 is divided by the area of the openings KK3 in the third-color sub pixels spx3.

Exemplarily, as shown in FIG. 3, FIG. 4E, FIG. 4F and FIG. 4G, a second ratio is formed between the area of the second spacers PS-2 and an area sum of the openings of the first-color sub pixels spx1 and the openings of the second-color sub pixels spx2. That is, the second ratio is a value after the area of the second spacers PS-2 is divided by the area sum of the openings of the first-color sub pixels spx1 and the openings of the second-color sub pixels spx2.

Exemplarily, as shown in FIG. 3, FIG. 4E, FIG. 4F and FIG. 4G, an area ratio of the first spacers PS-1 adjacent in the column direction (namely, the first direction F1) is 0.8-1.2. For example, an area ratio of the orthographic projection of the first spacers PS-1 adjacent in the column direction (namely, the first direction F1) on the base substrate 10 may be 0.8-1.2. Exemplarily, the area ratio of the first spacers PS-1 adjacent in the column direction (namely, the first direction F1) is 0.9-1.1. For example, the area ratio of the first spacers PS-1 adjacent in the column direction (namely, the first direction F1) may be 0.8. The area ratio of the first spacers PS-1 adjacent in the column direction (namely, the first direction F1) may also be 0.9. The area ratio of the first spacers PS-1 adjacent in the column direction (namely, the first direction F1) may also be 1.0. The area ratio of the first spacers PS-1 adjacent in the column direction (namely, the first direction F1) may also be 1.1. The area ratio of the first spacers PS-1 adjacent in the column direction (namely, the first direction F1) may also be 1.2. Certainly, in the practical application, it can be designed and determined according to the demands of the practical application, which is not limited here.

Exemplarily, as shown in FIG. 3, FIG. 4E, FIG. 4F and FIG. 4G, a first spacing distance HG1 is formed between the first spacers PS-1 adjacent in the column direction (namely, the first direction F1), a second spacing distance HG2 is formed between the second spacers PS-2 adjacent in the column direction (namely, the first direction F1), and the second spacing distance HG2 is greater than the first spacing distance HG1. Exemplarily, the first spacing distance HG1 may be a minimum distance between boundaries of the first spacers PS-1 adjacent in the column direction (namely, the first direction F1). The second spacing distance HG2 may be a minimum distance between boundaries of the second spacers PS-2 adjacent in the column direction (namely, the first direction F1).

Exemplarily, as shown in FIG. 3, FIG. 4E, FIG. 4F and FIG. 4G, a width of the first spacers PS-1 in the column direction (namely, the first direction F1) is greater than that of the second spacers PS-2 in the column direction (namely, the first direction F1), and a width of the first spacers PS-1 in a row direction (namely, the second direction F2) is not less than that of the second spacers PS-2 in the row direction (namely, the second direction F2). In this way, the area of the orthographic projection of the first spacers PS-1 on the base substrate 10 can be greater than the area of the orthographic projection of the second spacers PS-2 on the base substrate 10.

Exemplarily, as shown in FIG. 3, FIG. 4E, FIG. 4F and FIG. 4G, the sub pixels corresponding to the second spacers PS-2 may include the first-color sub pixels spx1 and the second-color sub pixels spx2, wherein the anode YG1 of one first-color sub pixel spx1 and the anode YG2 of one second-color sub pixel spx2 are disposed between the second spacers PS-2 adjacent in the column direction (namely, the first direction F1). In this way, the second spacers PS-2 adjacent in the column direction (namely, the first direction F1) can be spaced by the anode YG1 of one first-color sub pixel spx1 and the anode YG2 of one second-color sub pixel spx2.

Exemplarily, as shown in FIG. 3, FIG. 4E, FIG. 4F and FIG. 4G, the sub pixels corresponding to the first spacers PS-1 may include the third-color sub pixels spx3, wherein the anode YG3 of one third-color sub pixel spx3 is disposed between the first spacers PS-1 adjacent in the column direction (namely, the first direction F1). In this way, the first spacers PS-1 adjacent in the column direction (namely, the first direction F1) can be spaced by the anode YG3 of one third-color sub pixel spx3.

Exemplarily, as shown in FIG. 3, FIG. 4E, FIG. 4F and FIG. 4G, the columns where the first spacers PS-1 are located and the columns where the second spacers PS-2 are located are arranged alternately in the row direction (namely, the second direction F2), and the first spacers PS-1 and the second spacers PS-2 are arranged alternately on one straight line in the row direction (namely, the second direction F2). In this way, the first spacers PS-1 and the second spacers PS-2 may be arranged alternately in the row direction (namely, the second direction F2) and the column direction (namely, the first direction F1) so as to be uniformly arranged as much as possible.

Exemplarily, as shown in FIG. 3, FIG. 4E, FIG. 4F and FIG. 4G, a third ratio is formed between the width of the first spacers PS-1 in the row direction (namely, the second direction F2) and a width of the main body parts of the anodes in the corresponding sub pixels in the row direction. For example, a third ratio is formed between the width of the first spacers PS-1 in the row direction and a width of the main body parts ZT3 of the anodes YG3 in the third-color sub pixels spx3 in the row direction (namely, the second direction F2).

A fourth ratio is formed between the width of the second spacers PS-2 in the row direction (namely, the second direction F2) and a width of the main body part of the anode in one sub pixel between the two second spacers PS-2 adjacent in the column direction in the row direction. For example, a fourth ratio is formed between the width of the second spacers PS-2 in the row direction (namely, the second direction F2) and a width of the main body parts ZT1 of the anodes YG1 in the first-color sub pixels spx1 in the row direction (namely, the second direction F2), or a fourth ratio is formed between the width of the second spacers PS-2 in the row direction and a width of the main body parts ZT2 of the anodes YG2 in the second-color sub pixels spx2 in the row direction (namely, the second direction F2). Exemplarily, the third ratio may be greater than the fourth ratio. The third ratio may be a value after the width of the first spacers PS-1 in the row direction is divided by the width of the main body parts of the anodes in the corresponding sub pixels in the row direction. The fourth ratio may be a value after the width of the second spacers PS-2 in the row direction is divided by the width of the main body parts of the anodes in the corresponding sub pixels in the row direction.

Exemplarily, as shown in FIG. 3, FIG. 4E, FIG. 4F and FIG. 4G, the supporting layer 100 may further include a plurality of third spacers PS-3 disposed at intervals with the first spacers PS-1 and the second spacers PS-2. An area of the third spacers PS-3 is different from the area of the first spacers PS-1. An orthographic projection of the third spacers PS-3 in the column direction (namely, the first direction F1) does not overlap with the orthographic projections of both the first spacers PS-1 and the second spacers PS-2 in the column direction (namely, the first direction F1).

Exemplarily, as shown in FIG. 3, FIG. 4E, FIG. 4F and FIG. 4G, the second spacers PS-2 and the third spacers PS-3 are arranged alternately in one column, and the main body part of one sub pixel is disposed between the adjacent second spacers PS-2 and third spacers PS-3. Exemplarily, in the column direction, one third spacer PS-3 has the two adjacent second spacers PS-2, one of the two second spacers PS-2 is located above the third spacer PS-3, and the other second spacer PS-2 is located below the third spacer PS-3. Furthermore, the main body part ZT1 of one first-color sub pixel spx1 is disposed between the third spacer PS-3 and the second spacer PS-2 located above the third spacer PS-3, and the main body part ZT2 of one second-color sub pixel spx2 is disposed between the third spacer PS-3 and the second spacer PS-2 located below the third spacer PS-3.

Exemplarily, as shown in FIG. 3, FIG. 4E, FIG. 4F and FIG. 4G, a fifth ratio is formed between an area of the third spacers PS-3 and the area of the second spacers PS-2 and may be 0.8-1.2. Exemplarily, the fifth ratio may also be 0.9-1.1. For example, the fifth ratio may be 0.8. The fifth ratio may also be 0.9. The fifth ratio may also be 1.0. The fifth ratio may also be 1.1. The fifth ratio may also be 1.2. Certainly, in the practical application, it can be designed and determined according to the demands of the practical application, which is not limited here.

Exemplarily, as shown in FIG. 3, FIG. 4E, FIG. 4F and FIG. 4G, an overlapped region is at least formed between an orthographic projection of the third spacers PS-3 on the base substrate 10 and the orthographic projection of the via hole parts GB1 in the first-color sub pixels spx1 on the base substrate 10. Exemplarily, the orthographic projection of the third spacers PS-3 on the base substrate 10 can cover the orthographic projection of the via hole parts GB1 in the first-color sub pixels spx1 on the base substrate 10.

Exemplarily, as shown in FIG. 3, FIG. 4E, FIG. 4F and FIG. 4G, a sixth ratio is formed between a width of the third spacers PS-3 in the column direction and a width of the openings in the first-color sub pixels spx1 in the column direction. That is, the sixth ratio may be a value after the width of the third spacers PS-3 in the column direction is divided by the width of the openings in the first-color sub pixels spx1 in the column direction. Exemplarily, the sixth ratio may be 0.4-0.8. Exemplarily, the sixth ratio may also be 0.5-0.7. For example, the sixth ratio may be 0.4. The sixth ratio may also be 0.5. The sixth ratio may also be 0.6. The sixth ratio may also be 0.7. The sixth ratio may also be 0.8. Certainly, in the practical application, it can be designed and determined according to the demands of the practical application, which is not limited here.

Exemplarily, as shown in FIG. 3, FIG. 4E, FIG. 4F and FIG. 4G, a seventh ratio is formed between the width of the second spacers PS-2 in the column direction and a width of the openings in the second-color sub pixels spx2 in the column direction. That is, the seventh ratio may be a value after the width of the second spacers PS-2 in the column direction is divided by the width of the openings in the second-color sub pixels spx2 in the column direction. Exemplarily, the seventh ratio may be 0.4-0.8. For example, the seventh ratio may also be 0.5-0.7. Exemplarily, the seventh ratio may be 0.4. The seventh ratio may also be 0.5. The seventh ratio may also be 0.6. The seventh ratio may also be 0.7. The seventh ratio may also be 0.8. Certainly, in the practical application, it can be designed and determined according to the demands of the practical application, which is not limited here.

Exemplarily, as shown in FIG. 3, FIG. 4E, FIG. 4F and FIG. 4G, in the column direction, a first spacing HW1 is formed between the first spacers PS-1 and the openings KK3 of the adjacent third-color sub pixels spx3. In the column direction, a second spacing HW2 is formed between the second spacers PS-2 and the openings KK2 of the nearest-adjacent second-color sub pixels spx2, and a third spacing HW3 is formed between the second spacers PS-2 and the openings KK1 of the nearest-adjacent first-color sub pixels spx1. In the column direction, a fourth spacing HW4 is formed between the third spacers PS-3 and the openings KK2 of the nearest-adjacent second-color sub pixels spx2, and a fifth spacing HW5 is formed between the third spacers PS-3 and the openings KK1 of the nearest-adjacent first-color sub pixels spx1. The second spacing HW2, the third spacing HW3, the fourth spacing HW4 and the fifth spacing HW5 are each less than the first spacing HW1.

Exemplarily, a ratio between the second spacing HW2 and the third spacing HW3 may be 0.8-1.2. Exemplarily, the ratio between the second spacing HW2 and the third spacing HW3 may also be 0.9-1.1. For example, the ratio between the second spacing HW2 and the third spacing HW3 may be 0.8. The ratio between the second spacing HW2 and the third spacing HW3 may also be 0.9. The ratio between the second spacing HW2 and the third spacing HW3 may also be 1.0. The ratio between the second spacing HW2 and the third spacing HW3 may also be 1.1. The ratio between the second spacing HW2 and the third spacing HW3 may also be 1.2. Certainly, in the practical application, it can be designed and determined according to the demands of the practical application, which is not limited here.

Exemplarily, a ratio between the fourth spacing HW4 and the fifth spacing HW5 may be 0.8-1.2. Exemplarily, the ratio between the fourth spacing HW4 and the fifth spacing HW5 may also be 0.9-1.1. For example, the ratio between the fourth spacing HW4 and the fifth spacing HW5 may be 0.8. The ratio between the fourth spacing HW4 and the fifth spacing HW5 may also be 0.9. The ratio between the fourth spacing HW4 and the fifth spacing HW5 may also be 1.0. The ratio between the fourth spacing HW4 and the fifth spacing HW5 may also be 1.1. The ratio between the fourth spacing HW4 and the fifth spacing HW5 may also be 1.2. Certainly, in the practical application, it can be designed and determined according to the demands of the practical application, which is not limited here.

Exemplarily, as shown in FIG. 3, FIG. 4E, FIG. 4F and FIG. 4G, in the first-color sub pixels spx1, a distance HR1 between a boundary of the orthographic projection of the openings KK1 on the base substrate 10 and a nearest-adjacent boundary of the orthographic projection of the main body parts ZT1 in the first-color sub pixels spx1 on the base substrate 10 in the row direction is 1.5-3.0 μm. Exemplarily, in the first-color sub pixels spx1, the distance HR1 between the boundary of the orthographic projection of the openings KK1 on the base substrate 10 and the nearest-adjacent boundary of the orthographic projection of the main body parts ZT1 in the first-color sub pixels spx1 on the base substrate 10 in the row direction is 1.6-2.9 μm. For example, in the first-color sub pixels spx1, the distance HR1 between the boundary of the orthographic projection of the openings KK1 on the base substrate 10 and the nearest-adjacent boundary of the orthographic projection of the main body parts ZT1 in the first-color sub pixels spx1 on the base substrate 10 in the row direction may be 1.5 μm. In the first-color sub pixels spx1, the distance HR1 between the boundary of the orthographic projection of the openings KK1 on the base substrate 10 and the nearest-adjacent boundary of the orthographic projection of the main body parts ZT1 in the first-color sub pixels spx1 on the base substrate 10 in the row direction may also be 1.6 μm. In the first-color sub pixels spx1, the distance HR1 between the boundary of the orthographic projection of the openings KK1 on the base substrate 10 and the nearest-adjacent boundary of the orthographic projection of the main body parts ZT1 in the first-color sub pixels spx1 on the base substrate 10 in the row direction may also be 1.9 μm. In the first-color sub pixels spx1, the distance HR1 between the boundary of the orthographic projection of the openings KK1 on the base substrate 10 and the nearest-adjacent boundary of the orthographic projection of the main body parts ZT1 in the first-color sub pixels spx1 on the base substrate 10 in the row direction may also be 2.0 μm. In the first-color sub pixels spx1, the distance HR1 between the boundary of the orthographic projection of the openings KK1 on the base substrate 10 and the nearest-adjacent boundary of the orthographic projection of the main body parts ZT1 in the first-color sub pixels spx1 on the base substrate 10 in the row direction may also be 2.9 μm. In the first-color sub pixels spx1, the distance HR1 between the boundary of the orthographic projection of the openings KK1 on the base substrate 10 and the nearest-adjacent boundary of the orthographic projection of the main body parts ZT1 in the first-color sub pixels spx1 on the base substrate 10 in the row direction may also be 3.0 μm. Certainly, in the practical application, it can be designed and determined according to the demands of the practical application, which is not limited here.

Exemplarily, as shown in FIG. 3, FIG. 4E, FIG. 4F and FIG. 4G, in the first-color sub pixels spx1, a distance HR2 between the boundary of the orthographic projection of the openings KK1 on the base substrate 10 and the nearest-adjacent boundary of the orthographic projection of the main body parts ZT1 in the first-color sub pixels spx1 on the base substrate 10 in the column direction may be 1.5-3.0 μm. Exemplarily, in the first-color sub pixels spx1, the distance HR2 between the boundary of the orthographic projection of the openings KK1 on the base substrate 10 and the nearest-adjacent boundary of the orthographic projection of the main body parts ZT1 in the first-color sub pixels spx1 on the base substrate 10 in the column direction may also be 1.6-2.9 μm. For example, in the first-color sub pixels spx1, the distance HR2 between the boundary of the orthographic projection of the openings KK1 on the base substrate 10 and the nearest-adjacent boundary of the orthographic projection of the main body parts ZT1 in the first-color sub pixels spx1 on the base substrate 10 in the column direction may also be 1.5 μm. In the first-color sub pixels spx1, the distance HR2 between the boundary of the orthographic projection of the openings KK1 on the base substrate 10 and the nearest-adjacent boundary of the orthographic projection of the main body parts ZT1 in the first-color sub pixels spx1 on the base substrate 10 in the column direction may also be 1.6 μm. In the first-color sub pixels spx1, the distance HR2 between the boundary of the orthographic projection of the openings KK1 on the base substrate 10 and the nearest-adjacent boundary of the orthographic projection of the main body parts ZT1 in the first-color sub pixels spx1 on the base substrate 10 in the column direction may also be 1.9 μm. In the first-color sub pixels spx1, the distance HR2 between the boundary of the orthographic projection of the openings KK1 on the base substrate 10 and the nearest-adjacent boundary of the orthographic projection of the main body parts ZT1 in the first-color sub pixels spx1 on the base substrate 10 in the column direction may also be 2.0 μm. In the first-color sub pixels spx1, the distance HR2 between the boundary of the orthographic projection of the openings KK1 on the base substrate 10 and the nearest-adjacent boundary of the orthographic projection of the main body parts ZT1 in the first-color sub pixels spx1 on the base substrate 10 in the column direction may also be 2.9 μm. In the first-color sub pixels spx1, the distance HR2 between the boundary of the orthographic projection of the openings KK1 on the base substrate 10 and the nearest-adjacent boundary of the orthographic projection of the main body parts ZT1 in the first-color sub pixels spx1 on the base substrate 10 in the column direction may also be 3.0 μm. Certainly, in the practical application, it can be designed and determined according to the demands of the practical application, which is not limited here.

Exemplarily, as shown in FIG. 3, FIG. 4E, FIG. 4F and FIG. 4G, in the second-color sub pixels spx2, a distance HR3 between the boundary of the orthographic projection of the openings KK2 on the base substrate 10 and a nearest-adjacent boundary of the orthographic projection of the main body parts ZT2 in the second-color sub pixels spx2 on the base substrate 10 in the row direction may be 1.5-3.0 μm. Exemplarily, in the second-color sub pixels spx2, the distance HR3 between the boundary of the orthographic projection of the openings KK2 on the base substrate 10 and the nearest-adjacent boundary of the orthographic projection of the main body parts ZT2 in the second-color sub pixels spx2 on the base substrate 10 in the row direction may also be 1.6-2.9 μm. For example, in the second-color sub pixels spx2, the distance HR3 between the boundary of the orthographic projection of the openings KK2 on the base substrate 10 and the nearest-adjacent boundary of the orthographic projection of the main body parts ZT2 in the second-color sub pixels spx2 on the base substrate 10 in the row direction may also be 1.5 μm. In the second-color sub pixels spx2, the distance HR3 between the boundary of the orthographic projection of the openings KK2 on the base substrate 10 and the nearest-adjacent boundary of the orthographic projection of the main body parts ZT2 in the second-color sub pixels spx2 on the base substrate 10 in the row direction may also be 1.6 μm. In the second-color sub pixels spx2, the distance HR3 between the boundary of the orthographic projection of the openings KK2 on the base substrate 10 and the nearest-adjacent boundary of the orthographic projection of the main body parts ZT2 in the second-color sub pixels spx2 on the base substrate 10 in the row direction may also be 1.9 μm. In the second-color sub pixels spx2, the distance HR3 between the boundary of the orthographic projection of the openings KK2 on the base substrate 10 and the nearest-adjacent boundary of the orthographic projection of the main body parts ZT2 in the second-color sub pixels spx2 on the base substrate 10 in the row direction may also be 2.0 μm. In the second-color sub pixels spx2, the distance HR3 between the boundary of the orthographic projection of the openings KK2 on the base substrate 10 and the nearest-adjacent boundary of the orthographic projection of the main body parts ZT2 in the second-color sub pixels spx2 on the base substrate 10 in the row direction may also be 2.9 μm. In the second-color sub pixels spx2, the distance HR3 between the boundary of the orthographic projection of the openings KK2 on the base substrate 10 and the nearest-adjacent boundary of the orthographic projection of the main body parts ZT2 in the second-color sub pixels spx2 on the base substrate 10 in the row direction may also be 3.0 μm. Certainly, in the practical application, it can be designed and determined according to the demands of the practical application, which is not limited here.

Exemplarily, as shown in FIG. 3, FIG. 4E, FIG. 4F and FIG. 4G, in the second-color sub pixels spx2, a distance HR4 between the boundary of the orthographic projection of the openings KK2 on the base substrate 10 and the nearest-adjacent boundary of the orthographic projection of the main body parts ZT2 in the second-color sub pixels spx2 on the base substrate 10 in the column direction may be 1.5-3.0 μm. Exemplarily, in the second-color sub pixels spx2, the distance HR4 between the boundary of the orthographic projection of the openings KK2 on the base substrate 10 and the nearest-adjacent boundary of the orthographic projection of the main body parts ZT2 in the second-color sub pixels spx2 on the base substrate 10 in the column direction may also be 1.6-2.9 μm. For example, in the second-color sub pixels spx2, the distance HR4 between the boundary of the orthographic projection of the openings KK2 on the base substrate 10 and the nearest-adjacent boundary of the orthographic projection of the main body parts ZT2 in the second-color sub pixels spx2 on the base substrate 10 in the column direction may also be 1.5 μm. In the second-color sub pixels spx2, the distance HR4 between the boundary of the orthographic projection of the openings KK2 on the base substrate 10 and the nearest-adjacent boundary of the orthographic projection of the main body parts ZT2 in the second-color sub pixels spx2 on the base substrate 10 in the column direction may also be 1.6 μm. In the second-color sub pixels spx2, the distance HR4 between the boundary of the orthographic projection of the openings KK2 on the base substrate 10 and the nearest-adjacent boundary of the orthographic projection of the main body parts ZT2 in the second-color sub pixels spx2 on the base substrate 10 in the column direction may also be 1.9 μm. In the second-color sub pixels spx2, the distance HR4 between the boundary of the orthographic projection of the openings KK2 on the base substrate 10 and the nearest-adjacent boundary of the orthographic projection of the main body parts ZT2 in the second-color sub pixels spx2 on the base substrate 10 in the column direction may also be 2.0 μm. In the second-color sub pixels spx2, the distance HR4 between the boundary of the orthographic projection of the openings KK2 on the base substrate 10 and the nearest-adjacent boundary of the orthographic projection of the main body parts ZT2 in the second-color sub pixels spx2 on the base substrate 10 in the column direction may also be 2.9 μm. In the second-color sub pixels spx2, the distance HR4 between the boundary of the orthographic projection of the openings KK2 on the base substrate 10 and the nearest-adjacent boundary of the orthographic projection of the main body parts ZT2 in the second-color sub pixels spx2 on the base substrate 10 in the column direction may also be 3.0 μm. Certainly, in the practical application, it can be designed and determined according to the demands of the practical application, which is not limited here.

Exemplarily, as shown in FIG. 3, FIG. 4E, FIG. 4F and FIG. 4G, in the third-color sub pixels spx3, a distance HR5 between the boundary of the orthographic projection of the openings KK3 on the base substrate 10 and a nearest-adjacent boundary of the orthographic projection of the main body parts ZT3 in the third-color sub pixels spx3 on the base substrate 10 in the row direction may be 1.5-3.0 μm. Exemplarily, in the third-color sub pixels spx3, the distance HR5 between the boundary of the orthographic projection of the openings KK3 on the base substrate 10 and the nearest-adjacent boundary of the orthographic projection of the main body parts ZT3 in the third-color sub pixels spx3 on the base substrate 10 in the row direction may also be 1.6-2.9 μm. For example, in the third-color sub pixels spx3, the distance HR5 between the boundary of the orthographic projection of the openings KK3 on the base substrate 10 and the nearest-adjacent boundary of the orthographic projection of the main body parts ZT3 in the third-color sub pixels spx3 on the base substrate 10 in the row direction may also be 1.5 μm. In the third-color sub pixels spx3, the distance HR5 between the boundary of the orthographic projection of the openings KK3 on the base substrate 10 and the nearest-adjacent boundary of the orthographic projection of the main body parts ZT3 in the third-color sub pixels spx3 on the base substrate 10 in the row direction may also be 1.6 μm. In the third-color sub pixels spx3, the distance HR5 between the boundary of the orthographic projection of the openings KK3 on the base substrate 10 and the nearest-adjacent boundary of the orthographic projection of the main body parts ZT3 in the third-color sub pixels spx3 on the base substrate 10 in the row direction may also be 1.9 μm. In the third-color sub pixels spx3, the distance HR5 between the boundary of the orthographic projection of the openings KK3 on the base substrate 10 and the nearest-adjacent boundary of the orthographic projection of the main body parts ZT3 in the third-color sub pixels spx3 on the base substrate 10 in the row direction may also be 2.0 μm. In the third-color sub pixels spx3, the distance HR5 between the boundary of the orthographic projection of the openings KK3 on the base substrate 10 and the nearest-adjacent boundary of the orthographic projection of the main body parts ZT3 in the third-color sub pixels spx3 on the base substrate 10 in the row direction may also be 2.9 μm. In the third-color sub pixels spx3, the distance HR5 between the boundary of the orthographic projection of the openings KK3 on the base substrate 10 and the nearest-adjacent boundary of the orthographic projection of the main body parts ZT3 in the third-color sub pixels spx3 on the base substrate 10 in the row direction may also be 3.0 μm. Certainly, in the practical application, it can be designed and determined according to the demands of the practical application, which is not limited here.

Exemplarily, as shown in FIG. 3, FIG. 4E, FIG. 4F and FIG. 4G, in the third-color sub pixels spx3, a distance HR6 between the boundary of the orthographic projection of the openings KK3 on the base substrate 10 and the nearest-adjacent boundary of the orthographic projection of the main body parts ZT3 in the third-color sub pixels spx3 on the base substrate 10 in the column direction may be 1.5-3.0 μm. Exemplarily, in the third-color sub pixels spx3, the distance HR6 between the boundary of the orthographic projection of the openings KK3 on the base substrate 10 and the nearest-adjacent boundary of the orthographic projection of the main body parts ZT3 in the third-color sub pixels spx3 on the base substrate 10 in the column direction may also be 1.6-2.9 μm. For example, in the third-color sub pixels spx3, the distance HR6 between the boundary of the orthographic projection of the openings KK3 on the base substrate 10 and the nearest-adjacent boundary of the orthographic projection of the main body parts ZT3 in the third-color sub pixels spx3 on the base substrate 10 in the column direction may also be 1.5 μm. In the third-color sub pixels spx3, the distance HR6 between the boundary of the orthographic projection of the openings KK3 on the base substrate 10 and the nearest-adjacent boundary of the orthographic projection of the main body parts ZT3 in the third-color sub pixels spx3 on the base substrate 10 in the column direction may also be 1.6 μm. In the third-color sub pixels spx3, the distance HR6 between the boundary of the orthographic projection of the openings KK3 on the base substrate 10 and the nearest-adjacent boundary of the orthographic projection of the main body parts ZT3 in the third-color sub pixels spx3 on the base substrate 10 in the column direction may also be 1.9 μm. In the third-color sub pixels spx3, the distance HR6 between the boundary of the orthographic projection of the openings KK3 on the base substrate 10 and the nearest-adjacent boundary of the orthographic projection of the main body parts ZT3 in the third-color sub pixels spx3 on the base substrate 10 in the column direction may also be 2.0 μm. In the third-color sub pixels spx3, the distance HR6 between the boundary of the orthographic projection of the openings KK3 on the base substrate 10 and the nearest-adjacent boundary of the orthographic projection of the main body parts ZT3 in the third-color sub pixels spx3 on the base substrate 10 in the column direction may also be 2.9 μm. In the third-color sub pixels spx3, the distance HR6 between the boundary of the orthographic projection of the openings KK3 on the base substrate 10 and the nearest-adjacent boundary of the orthographic projection of the main body parts ZT3 in the third-color sub pixels spx3 on the base substrate 10 in the column direction may also be 3.0 μm. Certainly, in the practical application, it can be designed and determined according to the demands of the practical application, which is not limited here.

Exemplarily, as shown in FIG. 3, FIG. 4E, FIG. 4F and FIG. 4G, in the same repeating unit, the anodes YG1 in the first-color sub pixels spx1 and the anodes YG2 in the second-color sub pixels spx2 are arranged in the column direction. Furthermore, in the same repeating unit, a distance HK1 between the openings KK1 in the first-color sub pixels spx1 and the openings KK2 in the second-color sub pixels spx2 in the column direction may be 15-20 μm. Exemplarily, in the same repeating unit, the distance HK1 between the openings KK1 in the first-color sub pixels spx1 and the openings KK2 in the second-color sub pixels spx2 in the column direction may also be 16-19 μm. For example, in the same repeating unit, the distance HK1 between the openings KK1 in the first-color sub pixels spx1 and the openings KK2 in the second-color sub pixels spx2 in the column direction may also be 15 μm. In the same repeating unit, the distance HK1 between the openings KK1 in the first-color sub pixels spx1 and the openings KK2 in the second-color sub pixels spx2 in the column direction may also be 16 μm. In the same repeating unit, the distance HK1 between the openings KK1 in the first-color sub pixels spx1 and the openings KK2 in the second-color sub pixels spx2 in the column direction may also be 18 μm. In the same repeating unit, the distance HK1 between the openings KK1 in the first-color sub pixels spx1 and the openings KK2 in the second-color sub pixels spx2 in the column direction may also be 19 μm. In the same repeating unit, the distance HK1 between the openings KK1 in the first-color sub pixels spx1 and the openings KK2 in the second-color sub pixels spx2 in the column direction may also be 20 μm. Certainly, in the practical application, it can be designed and determined according to the demands of the practical application, which is not limited here.

Exemplarily, as shown in FIG. 3, FIG. 4E, FIG. 4F and FIG. 4G, in the same repeating unit, a distance HK2 between the openings KK1 in the first-color sub pixels spx1 and the openings KK3 in the third-color sub pixels spx3 in the second direction may be 15-20 μm. Exemplarily, in the same repeating unit, in the same repeating unit, the distance HK2 between the openings KK1 in the first-color sub pixels spx1 and the openings KK3 in the third-color sub pixels spx3 in the second direction may also be 16-19 μm. For example, in the same repeating unit, the distance HK2 between the openings KK1 in the first-color sub pixels spx1 and the openings KK3 in the third-color sub pixels spx3 in the second direction may also be 15 μm. In the same repeating unit, the distance HK2 between the openings KK1 in the first-color sub pixels spx1 and the openings KK3 in the third-color sub pixels spx3 in the second direction may also be 16 μm. In the same repeating unit, the distance HK2 between the openings KK1 in the first-color sub pixels spx1 and the openings KK3 in the third-color sub pixels spx3 in the second direction may also be 18 μm. In the same repeating unit, the distance HK2 between the openings KK1 in the first-color sub pixels spx1 and the openings KK3 in the third-color sub pixels spx3 in the second direction may also be 19 μm. In the same repeating unit, the distance HK2 between the openings KK1 in the first-color sub pixels spx1 and the openings KK3 in the third-color sub pixels spx3 in the second direction may also be 20 μm. Certainly, in the practical application, it can be designed and determined according to the demands of the practical application, which is not limited here.

Exemplarily, as shown in FIG. 3, FIG. 4E, FIG. 4F and FIG. 4G, orthographic projections of the second spacers PS-2 and the third spacers PS-3 arranged in the column direction in the row direction cover an orthographic projection of the first recess AX1 in the row direction.

Exemplarily, as shown in FIG. 3, FIG. 4E, FIG. 4F and FIG. 4G, an overlapped region is formed between the orthographic projection of the third spacers PS-3 in the column direction and an orthographic projection of the via hole parts GB2 in the second-color sub pixels SPX2 in the column direction. Exemplarily, the orthographic projection of the third spacers PS-3 in the column direction covers the orthographic projection of the via hole parts GB2 in the second-color sub pixels spx2 in the column direction.

Exemplarily, as shown in FIG. 3, FIG. 4E, FIG. 4F and FIG. 4G, the orthographic projection of the third spacers PS-3 in the column direction is located in an orthographic projection of the second recess AX2 in the column direction.

Exemplarily, as shown in FIG. 3, FIG. 4E, FIG. 4F and FIG. 4G, in the row direction, the third spacers PS-3, the via hole parts GB1 in the first-color sub pixels spx1, the via hole parts GB2 in the second-color sub pixels spx2 and the via hole parts GB3 in the third-color sub pixels spx3 are arranged on the same straight line.

It should be noted that all the above via holes and through holes may be formed into a circle, a square, an octangle and the like, which can be designed according to the demands of the practical application and is not limited here.

Figure 6:
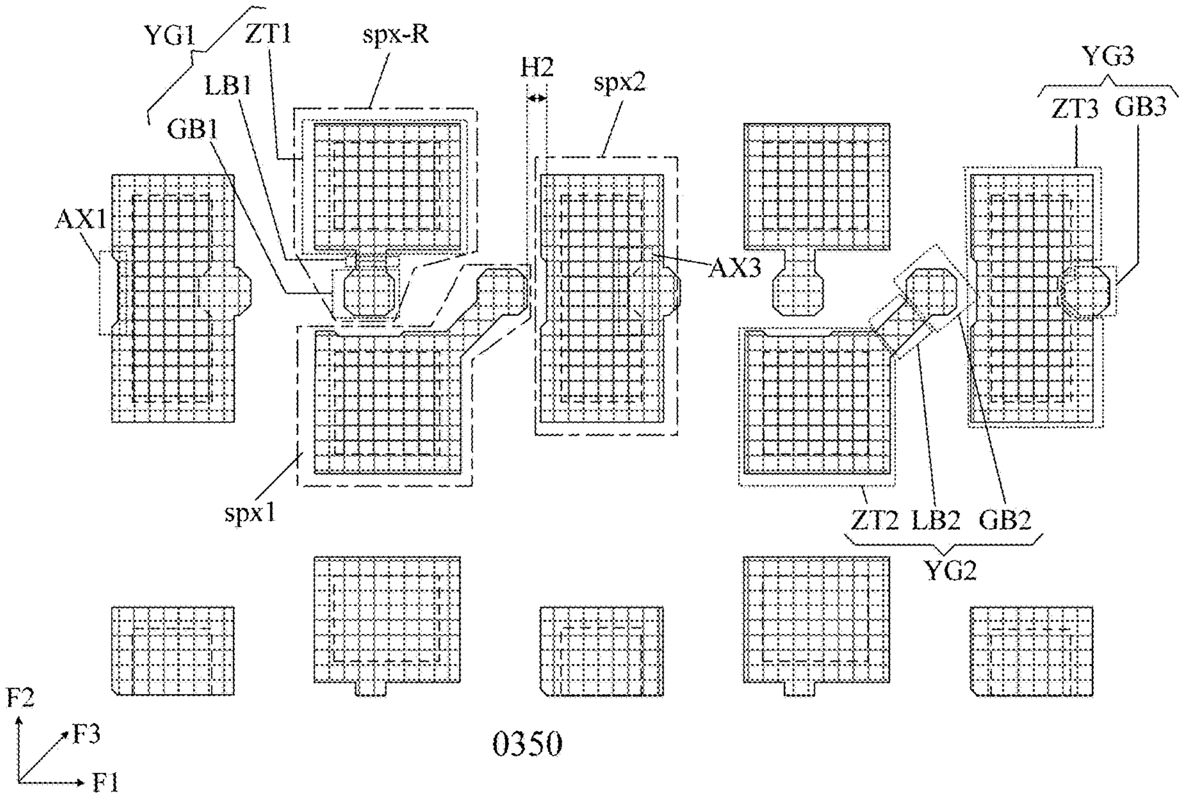
FIG. 6 is a schematic diagram of another first electrode layers provided by an embodiment of the present disclosure.

In some embodiments, as shown in FIG. 6, the first-color sub pixels spx1 may also be the green sub pixels, and the second-color sub pixels spx2 may be the blue sub pixels. At the moment, the first direction F1 may be the row direction of the sub pixels, and the second direction F2 may be the column direction of the sub pixels. The repeating units include the green sub pixels and the blue sub pixels sequentially arranged in the first direction F1. Furthermore, the repeating units may further include the red sub pixels, wherein the red sub pixels and the green sub pixels are arranged in the second direction F2. A first recess AX1 is formed on one side of the orthographic projection of the anodes in the blue sub pixels on the base substrate 10 facing the orthographic projection of the anodes in the green sub pixels on the base substrate 10.

In some embodiments, when the first-color sub pixels spx1 are the green sub pixels, and the second-color sub pixels spx2 are the blue sub pixels, as shown in FIG. 6, in the same repeating unit, the orthographic projection of the first via hole GK1 in the green sub pixel on the base substrate 10 is located between the orthographic projection of the anode in the green sub pixel on the base substrate 10 and the orthographic projection of the anode in the blue sub pixel on the base substrate 10.

In some embodiments, when the first-color sub pixels spx1 are the green sub pixels, and the second-color sub pixels spx2 are the blue sub pixels, as shown in FIG. 6, in the same repeating unit, the overlapped region is at least formed between an orthographic projection of the first recess AX1 of the anode in the blue sub pixel in the second direction F2 and the orthographic projection of the first via hole GK1 in the green sub pixel in the second direction F2.

In some embodiments, when the first-color sub pixels spx1 are the green sub pixels, and the second-color sub pixels spx2 are the blue sub pixels, as shown in FIG. 6, in the same repeating unit, the orthographic projection of the first recess AX1 of the anode in the blue sub pixel in the second direction F2 covers the orthographic projection of the first via hole GK1 in the green sub pixel in the second direction F2.

In some embodiments, when the first-color sub pixels spx1 are the green sub pixels, and the second-color sub pixels spx2 are the blue sub pixels, as shown in FIG. 6, the main body parts in the blue sub pixels have the first recesses AX1, and in the same repeating unit, the orthographic projection of the first recess AX1 in the second direction F2 covers the orthographic projection of the via hole part in the green sub pixel in the second direction F2.

In some embodiments, when the first-color sub pixels spx1 are the green sub pixels, and the second-color sub pixels spx2 are the blue sub pixels, as shown in FIG. 6, the edge of the orthographic projection of the first recesses AX1 on the base substrate 10 is roughly parallel to the edge of the orthographic projection of the via hole parts in the green sub pixels on the base substrate 10. It should be noted that in the practical technique, due to limitation of technique conditions or other factors such as wiring or forming of the via holes, the above parallel relationship only needs to roughly meet the above condition, which all fall within the protection scope of the present disclosure.

In some embodiments, when the first-color sub pixels spx1 are the green sub pixels, and the second-color sub pixels spx2 are the blue sub pixels, as shown in FIG. 6, the first distance between the edge of the orthographic projection of the first recesses AX1 on the base substrate 10 and the edge of the orthographic projection of the via hole parts in the green sub pixels on the base substrate 10 is not less than 2.5 μm. Further, the first distance may be 2.5-20 μm. For example, the first distance may be 2.5 μm. Alternatively the first distance may also be 3.5 μm. Alternatively the first distance may also be 20 μm, which is not limited here.

It should be noted that when the first-color sub pixels spx1 are the green sub pixels, and the second-color sub pixels spx2 are the blue sub pixels, a setting mode of the red sub pixels in the repeating units may refer to that of the above red sub pixels, which is not repeated here.

Exemplarily, the supporting layer and the pixel defining layer may be formed integrally. For example, the openings, the first spacers, the second spacers and the third spacers are prepared by adopting the same mask technique. Certainly, in the practical application, it can also be designed and determined according to the demands of the practical application, which is not limited here.

It should be noted that in the present application, the orthographic projection in the first direction (for example, the column direction) refers to a line projection on a straight line where the first direction (for example, the column direction) is located. In the present application, the orthographic projection in the second direction (for example, the row direction) refers to a line projection on a straight line where the second direction (for example, the row direction) is located.

Based on the same inventive concept, an embodiment of the present disclosure further provides a display apparatus, including the above display panel provided by the embodiment of the present disclosure. The display apparatus may be any product or component with a display function, such as a mobile phone, a tablet computer, a television, a displayer, a notebook computer, a digital photo frame and a navigator. It should be understood by a person of ordinary skill in the art that the display apparatus should have other essential constituent parts, which is not repeated here and may also not be regarded as limitation to the present disclosure. Implementation of the display apparatus may refer to that of the above display panel, which is not repeated here.

Although the preferred embodiments of the present disclosure have been described, those skilled in the art can make additional modifications and variations on the embodiments once they know the basic creative concept. Therefore, the appended claims intend to be explained as including the preferred embodiments and all modifications and variations falling within the scope of the present disclosure.

Obviously, those skilled in the art can make various modifications and variations to the present disclosure without departing from the spirit and scope of the present disclosure. In this way, if these modifications and variations of the present disclosure fall within the scope of the claims of the present disclosure and their equivalent art, the present disclosure also intends to include these modifications and variations.

What is claimed is:

1. A display panel, comprising:

a base substrate, comprising a plurality of sub pixels;

an active layer, wherein a channel region of a driving transistor of the active layer is S-shaped;

a first electrode layer, located on the base substrate and comprising anodes located in all the sub pixels;

a pixel defining layer, located on one side of the first electrode layer facing away from the base substrate; and a supporting layer, located on one side of the pixel defining layer facing away from the base substrate; wherein the supporting layer comprises a plurality of columns of first spacers and a plurality of columns of second spacers;

an anode of at least one of the sub pixels corresponding to the first spacers extends in a first direction, and the first spacers and the second spacers extend in a second direction respectively;

a first ratio is formed between an area of the first spacers and an area of the openings of the corresponding sub pixels, a second ratio is formed between an area of the second spacers and an area sum of the openings of all the sub pixels between two adjacent second spacers in the column direction, and the first ratio is different from the second ratio;

wherein the first ratio is greater than the second ratio; an area ratio of the first spacers adjacent in the column direction is 0.8-1.2;

wherein a first spacing distance is formed between the first spacers adjacent in the column direction, a second spacing distance is formed between the second spacers adjacent in the column direction, and the second spacing distance is greater than the first spacing distance;

wherein a width of the first spacers in the column direction is greater than a width of the second spacers in the column direction; and a width of the first spacers in a row direction is not less than a width of the second spacers in the row direction.

2. The display panel according to claim 1, wherein the columns where the first spacers are located and the columns where the second spacers are located are arranged alternately in the row direction; and the first spacers and the second spacers are arranged alternately on one straight line in the row direction.

3. The display panel according to claim 2, wherein a third ratio is formed between the width of the first spacers in the row direction and a width of the main body parts of the anodes in the corresponding sub pixels in the row direction;

a fourth ratio is formed between the width of the second spacers in the row direction and a width of the main body part of the anode in one sub pixel between two adjacent second spacers in the column direction in the row direction; and the third ratio is greater than the fourth ratio.

4. The display panel according to claim 2, wherein the supporting layer further comprises a plurality of third spacers disposed at intervals with the first spacers and the second spacers, and an area of the third spacers is different from the area of the first spacers; and an orthographic projection of the third spacers in the column direction does not overlap with orthographic projections of both the first spacers and the second spacers in the column direction.

5. The display panel according to claim 4, wherein the second spacers and the third spacers are arranged alternately in one column, and the main body part of the anode of one first-color sub pixel or one second-color sub pixel is disposed between adjacent second spacer and third spacer.

6. The display panel according to claim 4, wherein a fifth ratio is formed between an area of the third spacers and the area of the second spacers and is 0.8-1.2.

7. The display panel according to claim 4, wherein an overlapped region is at least formed between an orthographic projection of the third spacers on the base substrate and an orthographic projection of the via hole parts in the first-color sub pixels on the base substrate.

8. The display panel according to claim 4, wherein a sixth ratio is formed between a width of the third spacers in the column direction and a width of the openings in the first-color sub pixels in the column direction and is 0.4-0.8; and a seventh ratio is formed between the width of the second spacers in the column direction and a width of the openings in the second-color sub pixels in the column direction and is 0.4-0.8.

9. The display panel according to claim 8, wherein in the column direction, a first spacing is formed between the first spacers and the openings of the third-color sub pixels adjacent to the first spacers;

in the column direction, a second spacing is formed between the second spacers and the openings of the second-color sub pixels closest to the second spacers, and a third spacing is formed between the second spacers and the openings of the first-color sub pixels closest to the second spacers;

in the column direction, a fourth spacing is formed between the third spacers and the openings of the second-color sub pixels closest to the third spacers, and a fifth spacing is formed between the third spacers and the openings of the first-color sub pixels closest to the third spacers; and the second spacing, the third spacing, the fourth spacing and the fifth spacing are each less than the first spacing;

wherein a ratio between the second spacing and the third spacing is 0.8-1.2; and a ratio between the fourth spacing and the fifth spacing is 0.8-1.2.

10. The display panel according to claim 8, comprising a plurality of repeating units, wherein the repeating units comprise the first-color sub pixels, the second-color sub pixels and the third-color sub pixels; in each of the repeating units, the anode in the first-color sub pixel and the anode in the second-color sub pixel are arranged in the column direction; and in each of the repeating units, a distance between the opening in the first-color sub pixel and the opening in the second-color sub pixel in the first direction is 15-20 μm;

wherein in each of the repeating units, connecting lines among the anodes in the first-color sub pixel, the second-color sub pixel and the third-color sub pixel constitute a triangle; and in each of the repeating units, a distance between the opening in the first-color sub pixel and the opening in the third-color sub pixel in the second direction is 15-20 μm.

11. The display panel according to claim 4, wherein a first recess is formed on one side of an orthographic projection of one edges of the anodes in the second-color sub pixels on the base substrate facing an orthographic projection of the anodes in the first-color sub pixels on the base substrate, and the first recess is disposed towards centers of the main body parts of the second-color sub pixels; and orthographic projections in the row direction of both the second spacers and the third spacers arranged in the column direction cover an orthographic projection of the first recess in the row direction.

12. The display panel according to claim 11, wherein an overlapped region is formed between the orthographic projection of the third spacers in the column direction and an orthographic projection of the via hole parts in the second-color sub pixels in the column direction;

wherein a second recess is formed on one side of the orthographic projection of the main body parts in the third-color sub pixels on the base substrate facing an orthographic projection of the via hole parts in the second-color sub pixels on the base substrate; and the orthographic projection of the third spacers in the column direction is located in an orthographic projection of the second recess in the column direction.

13. The display panel according to claim 4, wherein in the row direction, the third spacers, the via hole parts in the first-color sub pixels, the via hole parts in the second-color sub pixels and the via hole parts in the third-color sub pixels are arranged on a same straight line.

14. The display panel according to claim 1, wherein the first-color sub pixels comprise at least one of followings:

a distance between a boundary of the orthographic projection of the openings on the base substrate and a boundary closest to the openings, of an orthographic projection of the main body parts in the first-color sub pixels on the base substrate being 1.5-3.0 μm in the row direction; and a distance between a boundary of the orthographic projection of the openings on the base substrate and a boundary, closest to the openings, of the orthographic projection of the main body parts in the first-color sub pixels on the base substrate being 1.5-3.0 μm in the column direction.

15. The display panel according to claim 1, wherein the second-color sub pixels comprise at least one of followings:

a distance between a boundary of the orthographic projection of the openings on the base substrate and a boundary closest to the openings, of an orthographic projection of the main body parts in the second-color sub pixels on the base substrate being 1.5-3.0 μm in the row direction; and a distance between a boundary of the orthographic projection of the openings on the base substrate and a boundary closest to the openings, of the orthographic projection of the main body parts in the second-color sub pixels on the base substrate being 1.5-3.0 μm in the column direction.

16. The display panel according to claim 1, wherein the third-color sub pixels comprise at least one of followings:

a distance between a boundary of the orthographic projection of the openings on the base substrate and a boundary closest to the openings, of an orthographic projection of the main body parts in the third-color sub pixels on the base substrate being 1.5-3.0 μm in the row direction; and a distance between a boundary of the orthographic projection of the openings on the base substrate and a boundary closest to the openings, of the orthographic projection of the main body parts in the third-color sub pixels on the base substrate being 1.5-3.0 μm in the column direction.

17. A display apparatus, comprising the display panel according to claim 1.

* * * * *